United States Patent
Retti

(10) Patent No.: US 9,837,570 B2
(45) Date of Patent: Dec. 5, 2017

(54) MULTIPLE LAYER SOLAR ENERGY HARVESTING COMPOSITION AND METHOD, SOLAR ENERGY HARVESTING BUCKYBALL, INDUCTIVE COUPLING DEVICE; VEHICLE CHASSIS; ATMOSPHERIC INTAKE HYDROGEN MOTOR; ELECTRICAL ENERGY GENERATING TIRE; AND MECHANICAL ENERGY HARVESTING DEVICE

(71) Applicant: Kahrl L Retti, Parkville, MD (US)

(72) Inventor: Kahrl L Retti, Parkville, MD (US)

( * ) Notice: Subject to any disclaimer, the term of this patent is extended or adjusted under 35 U.S.C. 154(b) by 0 days.

(21) Appl. No.: 13/673,595

(22) Filed: Nov. 9, 2012

(65) Prior Publication Data

US 2013/0278201 A1    Oct. 24, 2013

Related U.S. Application Data

(63) Continuation of application No. 11/498,759, filed on Aug. 4, 2006, now abandoned.
(Continued)

(51) Int. Cl.
*H02N 6/00* (2006.01)
*H01L 31/042* (2014.01)
(Continued)

(52) U.S. Cl.
CPC .......... *H01L 31/0583* (2013.01); *B60L 5/005* (2013.01); *B60L 8/00* (2013.01);
(Continued)

(58) Field of Classification Search
CPC ............. H01L 31/0583; H01L 31/0352; H01L 41/113; H02J 7/0052; H02J 7/35;
(Continued)

(56) References Cited

U.S. PATENT DOCUMENTS

| 3,433,676 A | 3/1969 | Stein |
| 3,493,923 A | 2/1970 | Trabold et al. |

(Continued)

FOREIGN PATENT DOCUMENTS

| EP | 0422696 A2 | 4/1991 |
| JP | S63-43381 A | 2/1988 |
| JP | H01-105582 A | 4/1989 |

OTHER PUBLICATIONS

Mihailovic, D. et al., "Orientational and Magnetic Ordering of Buckballs in TDAE-C60", Apr. 1995, Science, vol. 268, pp. 400-402.
(Continued)

*Primary Examiner* — Tamir Ayad
(74) *Attorney, Agent, or Firm* — Whiteford, Taylor & Preston, LLP; Gregory M. Stone

(57) ABSTRACT

A multiple layer composition and method for deposition of a solar energy harvesting strip onto a driving surface that will allow electric cars to charge by an inductive coupling is provided. The multiple layer composition includes at least one magnetic material for generating a magnetic field, wherein at least one of the multiple layers comprises the magnetic material. Further, the a multiple layer composition includes at least one solar energy harvesting material for converting at least one of thermal and photonic energy into electrical energy, wherein at least one of the multiple layers comprises the at least one solar energy harvesting material and wherein the at least one solar energy harvesting material is located within a magnetic field generated by the at least one magnetic material. One of the layers may also include a thermal energy harvesting material for converting thermal energy into electrical energy.

17 Claims, 13 Drawing Sheets

Related U.S. Application Data

(60) Provisional application No. 60/705,484, filed on Aug. 5, 2005, provisional application No. 60/810,162, filed on Jun. 2, 2006.

(51) Int. Cl.

| | | |
|---|---|---|
| *H02S 10/10* | (2014.01) | |
| *B60L 5/00* | (2006.01) | |
| *B60L 8/00* | (2006.01) | |
| *B60L 11/18* | (2006.01) | |
| *B60M 7/00* | (2006.01) | |
| *H01J 45/00* | (2006.01) | |
| *H01L 31/0352* | (2006.01) | |
| *H01L 41/113* | (2006.01) | |
| *H02K 7/18* | (2006.01) | |
| *H02N 2/18* | (2006.01) | |
| *H02J 7/00* | (2006.01) | |
| *F02M 21/02* | (2006.01) | |
| *H02S 99/00* | (2014.01) | |
| *H02J 7/35* | (2006.01) | |

(52) U.S. Cl.
CPC .............. *B60L 11/182* (2013.01); *B60M 7/00* (2013.01); *F02M 21/0206* (2013.01); *F02M 21/0227* (2013.01); *F02M 21/0296* (2013.01); *H01J 45/00* (2013.01); *H01L 31/0352* (2013.01); *H01L 41/113* (2013.01); *H02J 7/0052* (2013.01); *H02K 7/1876* (2013.01); *H02N 2/18* (2013.01); *H02S 99/00* (2013.01); *H02J 7/35* (2013.01); *Y02T 10/32* (2013.01); *Y02T 10/641* (2013.01); *Y02T 10/7005* (2013.01); *Y02T 10/7072* (2013.01); *Y02T 10/7083* (2013.01); *Y02T 90/122* (2013.01); *Y02T 90/14* (2013.01)

(58) Field of Classification Search
CPC .......... B60L 5/005; B60L 8/00; B60L 11/182; B60M 7/00; H01J 45/00; H02K 7/1876; H02N 2/18; Y02T 10/641; Y02T 10/7005; Y02T 10/7083; Y02T 10/32; Y02T 10/7072; Y02T 90/122; Y02T 90/14; F02M 21/0206; F02M 21/0227; F02M 21/0296; H02S 99/00
USPC ........................................................ 136/244
See application file for complete search history.

(56) References Cited

U.S. PATENT DOCUMENTS

| | | | |
|---|---|---|---|
| 3,971,454 A | | 7/1976 | Waterbury |
| 4,003,770 A | * | 1/1977 | Janowiecki ............... C23C 4/04 136/258 |
| 4,297,388 A | | 10/1981 | Kumar et al. |
| 4,453,030 A | | 6/1984 | David et al. |
| 4,504,761 A | | 3/1985 | Triplett |
| 4,636,577 A | | 1/1987 | Peterpaul |
| 4,714,797 A | | 12/1987 | Nagai |
| 4,836,344 A | | 6/1989 | Bolger |
| 4,885,995 A | | 12/1989 | Antosh |
| 4,964,793 A | | 10/1990 | Antosh |
| 4,987,833 A | | 1/1991 | Antosh |
| 5,065,085 A | * | 11/1991 | Aspden et al. ............... 322/2 R |
| 5,117,183 A | | 5/1992 | Santos |
| 5,207,304 A | * | 5/1993 | Lechner .................... B60L 9/00 191/10 |
| 5,277,996 A | | 1/1994 | Marchetti et al. |
| 5,573,090 A | | 11/1996 | Ross |
| 5,594,318 A | | 1/1997 | Nor et al. |
| 5,710,502 A | | 1/1998 | Poumey |
| 5,731,676 A | | 3/1998 | Nakamats |
| 5,821,728 A | | 10/1998 | Schwind |
| 5,880,661 A | * | 3/1999 | Davidson et al. ............ 335/306 |
| 5,936,022 A | * | 8/1999 | Freeman .............. C09D 163/00 524/442 |
| 6,013,871 A | * | 1/2000 | Curtin ................. H01G 9/2031 136/244 |
| 6,087,806 A | * | 7/2000 | Fujioka ............... B60L 11/1816 320/109 |
| 6,307,145 B1 | | 10/2001 | Kataoka et al. |
| 6,313,391 B1 | | 11/2001 | Abbott |
| 6,393,360 B1 | * | 5/2002 | Ma ........................ G01C 21/30 340/905 |
| 6,515,878 B1 | | 2/2003 | Meins et al. |
| 6,596,935 B2 | | 7/2003 | Lindsey et al. |
| 6,689,950 B2 | | 2/2004 | Cordaro |
| 6,783,745 B1 | | 8/2004 | Voronov et al. |
| 6,792,259 B1 | | 9/2004 | Parise |
| 6,831,221 B2 | | 12/2004 | Hulen |
| 6,879,889 B2 | | 4/2005 | Ross |
| 6,994,296 B2 | | 2/2006 | Schubert |
| 7,138,100 B2 | | 11/2006 | Smalley et al. |
| 7,663,502 B2 | | 2/2010 | Breed |
| 8,062,702 B2 | | 11/2011 | Barron et al. |
| 2001/0032666 A1 | | 10/2001 | Jenson et al. |
| 2002/0037383 A1 | | 3/2002 | Spillman, Jr. et al. |
| 2002/0069907 A1 | | 6/2002 | Yamashita |
| 2002/0084121 A1 | * | 7/2002 | Hulen .......................... 180/65.3 |
| 2003/0218927 A1 | | 11/2003 | Mayer et al. |
| 2004/0069897 A1 | | 4/2004 | Corcoran |
| 2004/0248336 A1 | * | 12/2004 | Shimizu ......... H01L 31/022425 438/57 |
| 2005/0034750 A1 | | 2/2005 | Rabinowitz |
| 2005/0126628 A1 | | 6/2005 | Scher et al. |
| 2005/0199282 A1 | | 9/2005 | Oleinick et al. |
| 2005/0274454 A1 | | 12/2005 | Extrand |

OTHER PUBLICATIONS

Gee, James M. et al., "Boron-Doped Back-Surface Field Using an Aluminum-Alloy Process", Sep. 1997, Sandia National Laboratories, Presented at the 26th IEEE Photovoltaic Specialists Conference, pp. 1-4.

"Solaroad—a new concept in transportation" by Anonymous Hero, Jun. 23, 2000, http://www.shouldexist.org/comments/2000/6/19/183337/249/0/post.

Fujii, Akihiko et al., "Photocurrent Enhancement in conducting Polymer Device by doping with Endohedral Metallofullerene La@C82", Apr. 2002, The Japan Society of Applied Physics, Part 1, No. 4A, pp. 2254-2255.

"Another Dawn for Solar Power" by Otis Port, Sep. 6, 2004, BusinessWeek Online, http://www.businessweek.com/magazine/content/04_36/b3898119_mz018.htm.

Wise, Solar Express, Popular Mechanics, Sep. 2005, pp. 99-103.

"Charging/generator interface for hybrid cars" by Anonymous Hero, Jan. 14, 2006, http://www.shouldexist.org/story/2006/1/12/22245/6709.

Choi, With Nanobatteries, Power Sources Finally Shrink with the Rest of Electronics, Scientific American, Feb. 2006, pp. 72-76.

Smalley, Better Solar Nanotubes to Split Water for Hydrogen, Scientific American, May 2006, p. 24.

Stone, An Ultracapacitor is What Really Keeps Going and Going . . . , Discover, Aug. 2006, p. 20.

\* cited by examiner

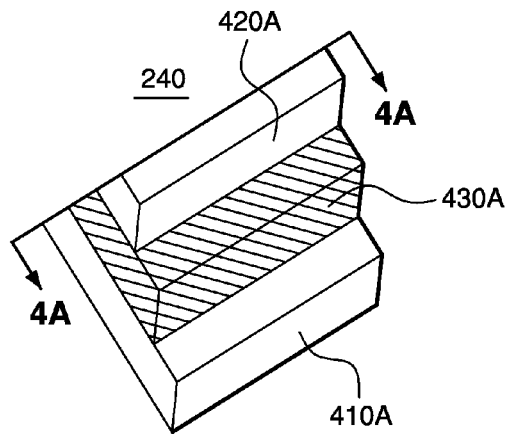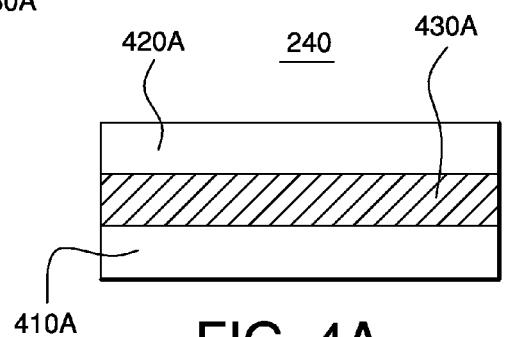
FIG. 4D
FIG. 4A
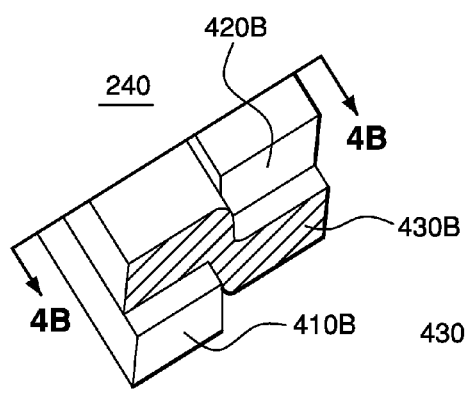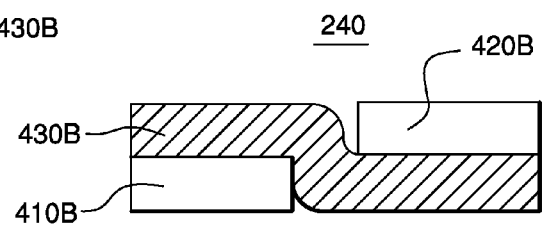
FIG. 4E
FIG. 4B
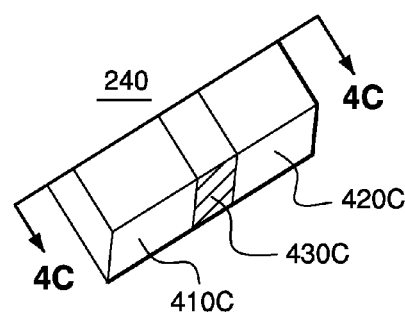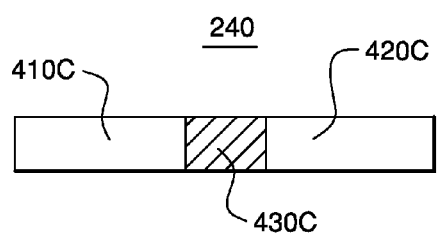
FIG. 4F
FIG. 4C

MULTIPLE LAYER SOLAR ENERGY HARVESTING COMPOSITION AND METHOD, SOLAR ENERGY HARVESTING BUCKYBALL, INDUCTIVE COUPLING DEVICE; VEHICLE CHASSIS; ATMOSPHERIC INTAKE HYDROGEN MOTOR; ELECTRICAL ENERGY GENERATING TIRE; AND MECHANICAL ENERGY HARVESTING DEVICE

CROSS-REFERENCE TO RELATED APPLICATION

This application claims the benefit under 35 U.S.C. §119 (e) of Provisional Patent Application No. 60/705,484, filed Aug. 5, 2005, Provisional Patent Application No. 60/810, 162, filed Jun. 2, 2006, and is a continuation under 35 U.S.C. §120 of patent application Ser. No. 11/498,759, filed Aug. 4, 2006, the entire disclosures of which are hereby incorporated by reference.

BACKGROUND OF THE INVENTION

Field of the Invention

The present invention relates to the generation of electrical energy from solar energy for applications such as powering electric vehicles by inductive coupling. More particularly, the present invention relates to a multiple layer solar energy harvesting composition and method used to form a solar energy harvesting strip along a road surface that allows passing electric vehicles to be powered by an inductive coupling thereto. Further, the present invention relates to a solar energy harvesting buckyball. Still further, the present invention relates to an inductive coupling device. Even further, the present invention relates to a vehicle chassis for storing electrical energy. Additionally, the present invention relates to an atmospheric intake hydrogen motor. Also, the present invention relates to an electrical energy generating tire. Further, the present invention relates to a mechanical energy harvesting device.

Description of the Related Art

As expanding energy use and environmental concerns have become of greater importance, interest has grown in available energy sources that are alternatives to fossil fuels, hydroelectric power and nuclear power. In today's alternate energy market, there are a number of different alternative energy systems being used. There are solar cells, known in the industry as photovoltaic cells, wind turbines which generate electricity using electrical generators driven by blades that catch the wind, solar furnaces which generate electricity using electrical generators driven by steam that is produced by catching and magnifying heat from the sun, hydrogen fuel cells which derive hydrogen from gasoline or methane, straight hydrogen motors for vehicles which burn hydrogen that is stored thereon, and electric cars which rely on batteries to power them. All of these technologies have significant hurdles to overcome.

A significant problem with solar cell technology is that large areas of land are needed to establish solar fields with a high enough yield to be practical. Solar cells have been improved over the years to be more effective at converting sunlight into electricity, but even the best solar cells are only about 20% efficient at conversion. Further, solar cells have limited wave length efficiency and on cloudy or rainy days, there is little or no generation of electricity. This means that in order to compete with other methods of electrical generation, large numbers of solar arrays must be directed at the sun during the daylight hours. It is very expensive to build these arrays and they require extensive amounts of land.

Like solar energy, wind fields are constructed to take advantage of a natural process to generate electricity. The disadvantages of wind generation are the amount of land required, costs of construction, and inconsistent nature of wind. These disadvantages all add up to, as with solar cell technology, relying on natural processes that are undependable.

Solar furnaces also rely on the sun to fuel them. At night and on cloudy days they become ineffective. Thus the generation of electricity during a rainstorm becomes substantially impossible. As with solar energy and wind fields, solar furnaces are inefficient because they only generate energy for a part of a day.

Much has been written about the conversion of vehicles to burn hydrogen or other natural gases to help curb the use of oil. Hydrogen fuel cell vehicles are now being constructed by every major car manufacturer. Hydrogen's major drawbacks are production and storage. In a hydrogen fuel cell vehicle the range is only about 90 miles at best. Hydrogen fuel cells require hydrogen which when produced generates greenhouse gases. Additionally, storing hydrogen for consumption on a vehicle is complicated due to the nature of hydrogen in its gaseous state. Thus, liquefying hydrogen creates the problem of putting cold storage tanks in vehicles which would vastly increase the cost of the vehicle. Also, a cold storage tank would occupy a significant amount of space within a vehicle so as to store enough hydrogen to get near the number of miles per tank the average car gets now.

Electric vehicles which rely solely on batteries to power them suffer from problems such as limited range, and this has forced most auto producers to abandon the purely electric car as an alternative to the internal combustion engine. Even when electric vehicles are coupled with solar cell technology, most solar cells are inefficient because of a number of limiting factors, including wave refraction and reflection, weather problems, and so forth, and therefore fall short of delivering enough energy. Hybrid cars combine an internal combustion engine with a generator, electric motors and batteries. However, such cars still produce greenhouse gases, and other harmful pollutants.

In addition to the growing interest in alternative energy sources, interest is growing in an energy economy of increased efficiency. In a conventional energy economy, an open loop energy consumption process is practiced. In the open loop energy consumption process energy is purchased as it is utilized from a centralized energy system. However, the open loop system is inefficient as the energy consumer never generates and adds energy to the system. On the other hand, in a closed loop consumption process, the inefficiencies of the open loop system can be avoided by having the consumer generate and add energy to the energy system. By way of example, in the context of vehicles, if 20 million of the 100 million vehicles in the U.S. operated to supplement one hour of electricity to the centralized energy system, that would total 20 million hours a day of usable electricity.

Accordingly, a need exists for an improved means to generate energy where the generated energy could be used for a vehicle. Additionally, a need exists for a system that allows for a practical closed loop energy consumption process.

SUMMARY OF THE INVENTION

An aspect of the invention is to provide a multiple layer solar energy harvesting composition and method used to form a solar energy harvesting strip on a road surface that allows passing electric vehicles to be powered by an inductive coupling thereto. Solar energy includes at least thermal and/or photonic energy.

Another aspect of the present invention is to provide a solar energy harvesting buckyball for use in a solar energy harvesting strip and an electric vehicle for use with the solar energy harvesting strip.

A further aspect is to provide a method for harvesting solar energy comprising depositing a plurality of layers onto a surface area that is incident to solar energy, wherein at least one of the plurality of layers comprises at least one solar energy harvesting material and at least one of the plurality of layers comprises at least one magnetic material. Further, the method comprises converting at least one of thermal and photonic energy into electrical energy by the at least one solar energy harvesting material, wherein the at least one solar energy harvesting material is located within a magnetic field generated by the at least one magnetic material.

A still further exemplary embodiment of the present invention provides a multiple layer solar energy harvesting composition for deposition onto a surface area that is incident to solar energy, comprising at least one magnetic material for generating a magnetic field, wherein at least one of the multiple layers comprises the magnetic material. Further, the composition comprises at least one solar energy harvesting material for converting at least one of thermal and photonic energy into electrical energy, wherein at least one of the multiple layers comprises the at least one solar energy harvesting material and wherein the at least one solar energy harvesting material is located within a magnetic field generated by the at least one magnetic material.

A yet further exemplary embodiment of the present invention provides a method for harvesting solar energy, comprising depositing a plurality of layers onto a surface area that is incident to solar energy, wherein at least one of the plurality of layers comprises thermal energy harvesting material and at least one of the plurality of layers comprises a photonic energy harvesting material. Further, the method comprises converting thermal and photonic energy into electrical energy by the thermal and photonic energy harvesting materials, respectively.

An additional exemplary embodiment of the present invention provides a multilayer solar energy harvesting composition for deposition onto a surface area that is incident to solar energy, comprising a thermal energy harvesting material for converting thermal energy into electrical energy, wherein at least one layer comprises the thermal energy harvesting material. Further, the composition comprises a photonic energy harvesting material for converting photonic energy into electrical energy, wherein at least one layer comprises the thermal energy harvesting material.

Another exemplary embodiment of the present invention provides a carbon buckyball for harvesting solar energy, comprising a thermal energy harvesting material on at least a portion of the exterior of the buckyball for converting thermal energy into electrical energy. Further, the buckyball comprises a photonic energy harvesting material on at least a portion of the exterior of the buckyball for converting photonic energy into electrical energy.

Still another exemplary embodiment of the present invention provides an inductive coupling device for a vehicle, said vehicle being at least partially powered by electrical energy, the inductive coupling device comprises a spherical inductive coupler for inducing current in a magnetic field.

A further exemplary embodiment of the present invention provides a vehicle chassis for storing electrical energy for use in a vehicle that is at least partially powered by electrical energy, the vehicle chassis comprises a first conductor; a second conductor; and a material for energy storage disposed between the first and second conductors, wherein the chassis supports a body of the vehicle.

An additional exemplary embodiment of the present invention provides an atmospheric intake hydrogen motor that obtains hydrogen fuel from condensed atmospheric water vapor, the atmospheric intake hydrogen motor comprises an atmospheric intake for intaking air; at least one sensor for sensing at least one characteristic of the intaken air; a condensation bladder for condensing water from the air; and a cooling and/or heating device for cooling or heating the condensation bladder according to the sensed at least one characteristic of the intaken air, wherein the cooling and/or heating device cools or heats the condensation bladder to condensate the water from the air.

Yet an additional exemplary embodiment of the present invention provides an electrical energy generating tire for a vehicle, the electrical energy generating tire comprises a first reinforcement strip formed circumferentially on the tire, the first reinforcement strip comprising a conductive material and forming as a positive conductor; a second reinforcement strip formed circumferentially on the tire, formed circumferentially on the tire, the second reinforcement strip comprising the conductor material and forming as a negative conductor; a annular strip comprised of piezo ceramic material and/or thermal harvesting material that is disposed between the first and second reinforcement strip; and at least one sidewall conductor coupled to at least one of the first and second reinforcement strips.

Still another exemplary embodiment of the present invention provides a mechanical energy harvesting device for converting mechanical motion into electrical current for use in a vehicle, the mechanical energy harvesting device comprises an electrical winding; a magnetic travel rod surrounded by the winding and moveable relative to the winding; wherein electrical current is induced when the magnetic travel rod moves relative to the winding Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other objects, features, and advantages of certain embodiments of the present invention will be more apparent from the following description taken in conjunction with the accompanying drawings, in which:

FIGS. 4A-4C illustrate cross sectional views of alternative embodiments for the conductive layer;

FIGS. 4D-4F illustrate perspective views of the alternative embodiments for the conductive layer illustrated in FIGS. 4A-4C;

Throughout the drawings, the same drawing reference numerals will be understood to refer to the same elements, features, and structures.

DETAILED DESCRIPTION OF EXEMPLARY EMBODIMENTS

The matters defined in the description such as a detailed construction and elements are provided to assist in a comprehensive understanding of the embodiments of the invention and are merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

Figure 1:
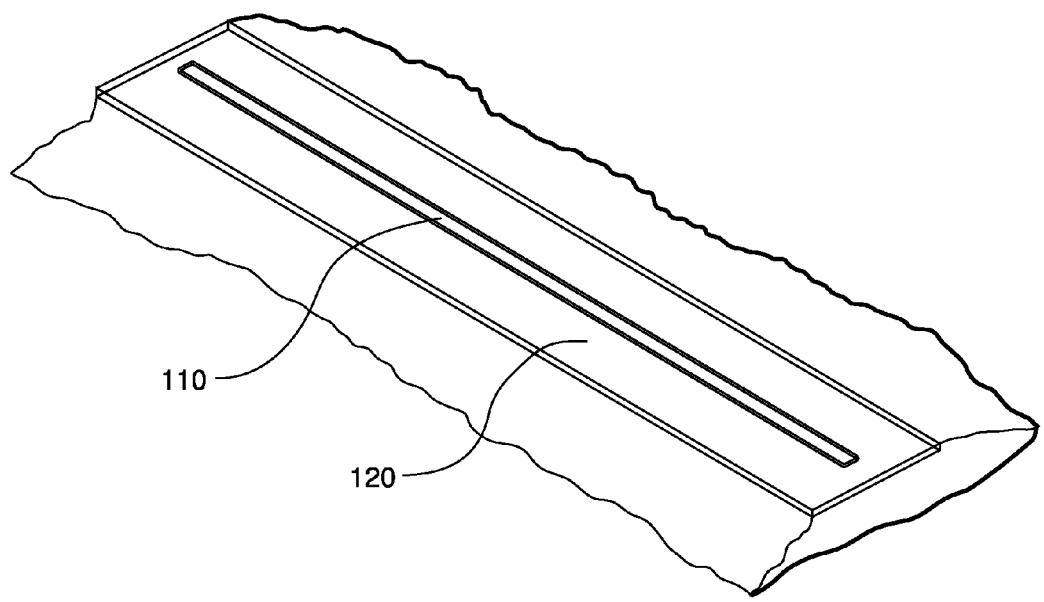
FIG. 1 illustrates a solar energy harvesting strip according to an exemplary embodiment of the present invention.

Exemplary embodiments of the present invention include apparatuses, systems and methods for harvesting solar energy. Solar energy includes both thermal and photonic energy. Preferably, a multiple layer solar energy harvesting composition is embodied as a strip provided on a driving surface that allows electric vehicles to inductively receive energy as they traverse the driving surface. FIG. 1 illustrates a solar energy harvesting strip according to an exemplary embodiment of the present invention. In FIG. 1, a solar energy harvesting strip 110 between about 1" to about 24" wide is provided at the center of driving surface 120. The position at the center of the driving surface 120 is presented as an example only, and the solar energy harvesting strip 110 could be positioned at any suitable position on the driving surface 120. Further, the width of about 1" to about 24" is merely exemplary, and in other exemplary embodiments of the present invention the width can be varied as required by the application or location. Additionally, while solar energy harvesting strip 110 is shown in FIG. 1 as being provided on the driving surface 120, the solar energy harvesting composition could be provided on any other permanent surface and could be embodied in any form, as required by the application or location. For example, the solar energy harvesting composition could be applied to roadways, barrier walls, lampposts, rooftops, curbs, and so forth and be formed according to the surface it is applied on.

According to an exemplary embodiment of the present invention, a method of application for the solar energy harvesting strip 110, described in greater detail below, comprises the steps of spraying multiple coats in rapid succession onto the driving surface 120. However any number of methods of deposition, such as hand application, film deposition, and so forth, can be used for any one or all of the constituent components of the solar energy harvesting composition.

The above solar energy harvesting strip 110, according to exemplary embodiments of the present invention, merges solar harvesting and linear magnetic generation technologies. In exemplary embodiments of the present invention, photonic harvesting materials could be used for the conversion of photonic energy into electrical energy. However, in other embodiments of the present invention, thermal harvesting materials could be used to convert thermal energy into electrical energy. The solar energy harvesting composition may comprise only one or both of the photonic and thermal harvesting materials. When using both photonic and thermal energy to generate electricity, embodiments of the present invention are up to 50% more efficient than conventional solar cells. Conventional solar cells become less efficient as they heat up, whereas embodiments of the present invention using both photonic and thermal energy become more efficient.

In exemplary embodiments of the present invention, a solar energy harvesting strip 110 comprises a linear magnetic field generator for generating electrical flow. A linear magnetic field generator requires great distances in order to create a magnetic field capable of generating any appreciable current. Such distances could be achieved by the placement of the solar energy harvesting strip 110 on a length of driving surface 120 so as to produce a linear magnetic field generator. In this case, since the magnetic fields could be created over long distances, very little current would be needed from the solar harvesting materials. Even weak current flow creates magnetic fields of sufficient strength. Further, since magnetic fields are unaffected by ice, snow, dirt and so forth, keeping the surface clean and well maintained is of less importance. According to an exemplary embodiment of the present invention a vehicle passes over the solar energy harvesting strip 110 to power the vehicle. The vehicle receives power by having an inductive coupling device affixed thereto that passes through the magnetic field thereby producing electrical flow.

Figure 2:
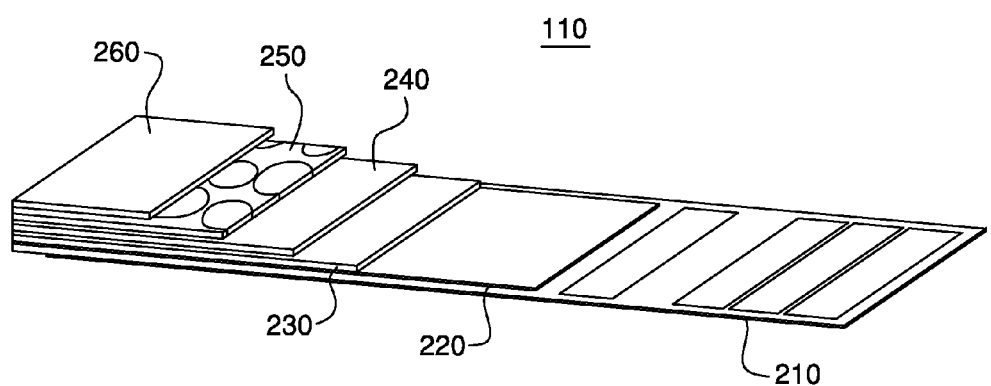
FIG. 2 illustrates a first exemplary embodiment of the solar energy harvesting strip in elemental form.

First Exemplary Embodiment of the Solar Energy Harvesting Strip:

A first exemplary embodiment of the solar energy harvesting strip 110 in elemental form is illustrated in detail in FIG. 2. The solar energy harvesting strip 110 comprises a multiple layer solar energy harvesting composition comprised of a bonding layer 210, magnetic layer 220, a thermal harvesting layer 230, a conductive layer 240, a photonic harvesting layer 250, and a sealing layer 260. These components are shown and arranged as one example, and in other embodiments of the present invention, components can be combined, added, removed and/or rearranged as required by the application or location. Further, all of the layers may be formed having the same width or the layers may be formed such that each layer positioned on top of another layer is narrower than the layer beneath it. Still further, the edged of any of the layers may be squared, rounded, or tapered. In FIG. 2, the energy harvesting composition is embodied as a strip, but may be formed in any configuration as required by the application or location.

In operation, the thermal harvesting layer 230 and/or photonic harvesting layer 250 convert thermal and/or photonic energy into electrical energy. The electrical energy migrates across and/or between the layers of the energy harvesting composition. In one embodiment, the electrical energy migrates along conductive traces on any of the layers and/or conductive ladders between any of the layers. In another embodiment, electrical energy flows through and between the layers of the energy harvesting composition without any conductive traces or ladders.

When a conductive layer 240 is included, the electrical energy migrates to the conductive layer 240 under the influence of a magnetic field generated by the magnetic layer 220 and/or bonding layer 210. Conductive layer 240 stores the electrical energy and generates an electric field which augments the magnetic field. Further, conductive layer 240 may be attached to an electrical energy consumption, transmission and/or storage device. When the energy harvesting composition is embodied as a strip and conductive layer 240 is attached to an electrical energy consumption, transmission and/or storage device, one or more attachments may occur along the strip.

When a conductive layer 240 is not included, electrical flow occurs within and/or between the layers and generates an electric field which augments the magnetic field. With or without conductive layer 240, the augmented magnetic field couples the energy harvested by the thermal harvesting layer 230 and/or photonic harvesting layer 250 to an electric vehicle and/or other remote devices. In another embodiment, the electrical energy is used to energize inductive coils that are used to couple the energy harvested by the thermal harvesting layer 230 and/or photonic harvesting layer 250 to an electric vehicle and/or other remote devices. A better understanding of the first exemplary embodiment of the solar energy harvesting strip 110 will be achieved through the following detailed discussion.

Bonding layer 210 is preferably comprised of a rubber or asphalt type adhesive and functions as a bonding agent between a surface on which the solar energy harvesting strip is applied and a subsequent layer. Further, the bonding layer 210 may additionally function to fill any cracks and/or fissures in the surface it is applied to, such as driving surface 120. In an exemplary embodiment of the present invention, bonding layer 210 comprises a soft ferromagnetic material suspended in a rubberized material. When bonding layer 210 comprises the soft ferromagnetic material, the bonding layer 210 additionally functions to generate a magnetic field that becomes magnetized by magnetic layer 220. Further, bonding layer 210 may function to electrically insulate the other layers from the surface it is applied to. Exemplary soft ferromagnetic materials include iron, soft iron, steel and magnetite. However, any magnetic material may be used.

Magnetic layer 220 is comprised of a permanent magnetic material. The magnetic layer 220 has a magnetic field that is perpendicular to the field in place, such as the field generated by the bonding layer 210 when the bonding layer 210 includes a soft ferromagnetic material. Magnetic layer 220 functions to generate a magnetic field, which will be described in greater detail below. The permanent magnetic material of magnetic layer 220 may be a permanent hard ferromagnetic material. Exemplary hard ferromagnetic materials include strontium ferrite, strontium ferrite powder, strontium ferrite powder in a polymer base, steel, iron, nickel, cobalt, suspensions of magnetite, soft iron in epoxy, iron nickel alloy, ceramic, alnico, and rare earth magnetic materials. However, any permanent magnetic material may be used.

Thermal harvesting layer 230 is comprised of a thermal electric and/or thermionic material. The thermal harvesting layer 230 converts thermal energy into electrical energy. It is not necessary for the thermal energy to originate as solar energy. Thermal harvesting layer 230 may be combined with one or both of the bonding layer 210 and magnetic layer 220. Exemplary thermal electric and/or thermionic materials include strontium and barium strontium titanates. Barium strontium titanates is a material that when heated causes electrical current to flow. Beside the above exemplary thermal electric and/or thermionic materials, any thermal electric and/or thermionic materials may be used.

Conductive layer 240 is comprised of at least two conductors separated by a dielectric or insulative material. The conductors collect the electrical energy from the thermal harvesting layer 230 and the photonic harvesting layer 250. When used with a dielectric, the conductors form a parallel plate discharge capacitor. One of the conductors functions as a positively charged plate whereas the other functions as a negatively charged plate. Preferably, if thermal harvesting layer 230 is comprised of a thermionic material and is positioned adjacent to conductive layer 240, the conductor closest to the thermal harvesting layer 230 may function as the positively charged plate. Exemplary materials for the conductors include aluminum oxide, aluminum dioxide, indium tin oxide, indium tin oxide laced with graphite, any conducting metal, and thin film mono pole plastics such as a polyamide. Additionally, the conductor may be comprised of carbon modified epoxies or silicate modified crynoacrylates, which have been developed to cope with strength and durability issues. The conductors may be comprised of the same material or may each be comprised of different materials. Exemplary dielectric materials include graphite, carbon and activated carbon. Further, it is preferred that conductive layer 240 is attached to an electrical energy consumption, transmission and/or storage device so as to be part of a complete circuit. Examples of which includes street lights, power grids and batteries, respectively. Attachments to the conductive layer 240 for the purpose of drawing energy from it may occur at one or more positions. Further, one of the plates of the conductors may be coupled to earth ground.

Photonic harvesting layer 250 is comprised of a photonic harvesting material and converts photonic energy into electrical energy. The photonic harvesting material may be a photovoltaic material that comprises solid state junction diodes which comprise an NPN type diode of purified silicon, doped with impurities such as germanium. However, other impurities may be used as a dopant in addition to or instead of germanium. In addition, the photonic harvesting material may be MgZn oxides that are dye sensitized, dirty silicates, polymer films laced with nanocrystals, and organic based films such as phenylene. Moreover, the photonic harvesting material may comprise a film deposition of the phototonic harvesting material on a plastic that supports monopole charges. In such an arrangement the film can then be bonded to the conductive layer 240. In yet another example, the photonic harvesting material may be comprised of conventional type solar cells that are bonded to the conductive layer 240 and which have an N layer of silicon applied by spray or film deposition. Alternatively, the photonic harvesting material may be a composition that makes use of dye sensitized zinc oxide enriched with magnesium. This composition pushes the useable wavelength to 800 nanometers, thereby allowing energy to be harvested from the infrared spectrum. Furthermore, photonic harvesting layer 250 may comprise a fractal lens structure or include clear N layers to allow for the transmission of photons through the substrate to be used again on a second NPN type diode and so forth.

Sealing layer 260 is comprised of a sealing material. Exemplary sealing materials include PFTEE which is a member of the Teflon family. However, certain epoxies modified by silicates or carbon may be used as well. Additionally, a combination of cynoacrylates and silicates may be used as well.

The layers described above with reference to FIG. 2 are merely one exemplary arrangement. In other embodiments of the present invention, components can be combined, added, removed and/or rearranged as required by the application or location. For instance, the use of strontium as a magnetic as well as thermal electrical material may eliminate the need for the application of a separate thermal harvesting layer. In other words, by using a material that functions as both a magnetic as well as thermal electrical material, the structures and/or functions of two or more of the bonding layer 210, magnetic layer 220 and a thermal harvesting layer 230 may be combined. Additionally, it is not necessary for the thermal harvesting layer 230 to be located between the magnetic layer 220 and the thermal harvesting layer 230, as the thermal harvesting layer 230 may be located at any point in the layered structure of the solar energy harvesting composition which forms the solar energy harvesting strip 110. Furthermore, the structure and/or function of one or more of the bonding layer 210, magnetic layer 220, thermal harvesting layer 230, conductive layer 240, photonic harvesting layer 250, and sealing layer 260 may be omitted or combined. Additionally, other layers with redundant and/or additional functions and/or structures may be added.

Figure 3A:
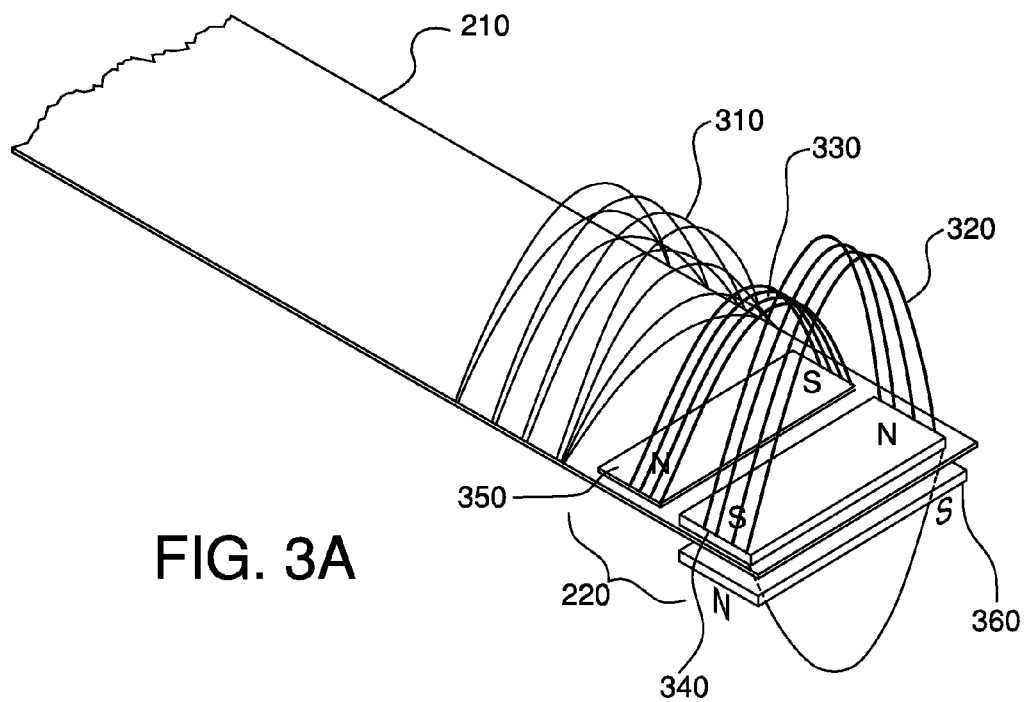
FIG. 3A illustrates a detailed view of the bonding layer and magnetic layer.
Figure 3B:
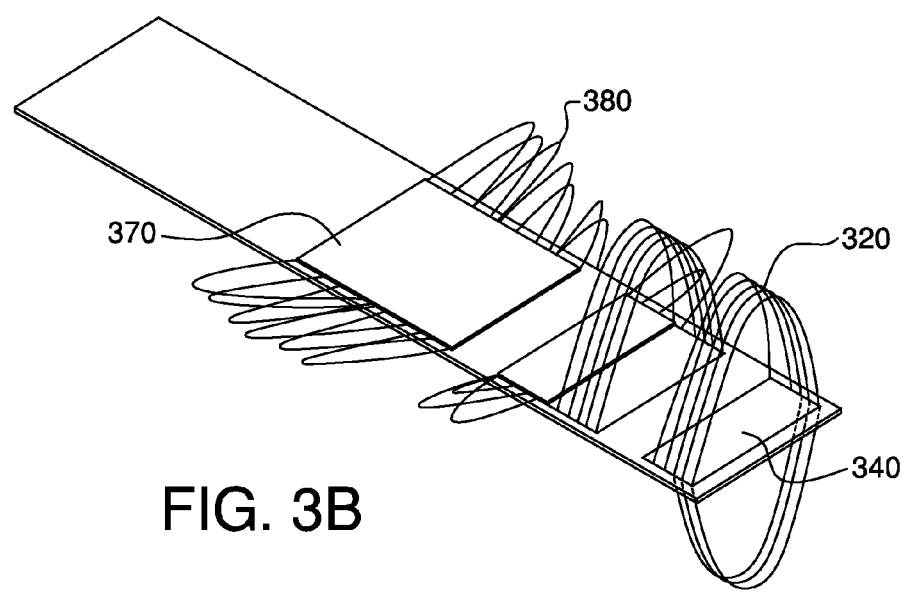
FIG. 3B illustrates a detailed view of the bonding layer and magnetic layer in an exemplary embodiment where the bonding layer and magnetic layer are used to convey information.

Exemplary Structure of Bonding Layer and Magnetic Layer:

A better understanding of the bonding layer 210 and magnetic layer 220 will be achieved through the following detailed discussion with reference to FIGS. 3A and 3B. FIG. 3A shows the structure of bonding layer 210 and magnetic layer 220 in greater detail, in accordance with an exemplary embodiment of the present invention. In FIG. 3A, bonding layer 210 comprises a soft ferro magnetic material and magnetic layer 220 comprises a hard ferro magnetic material. The soft ferro magnetic material of bonding layer 210 generates a magnetic field 310. Preferably, the hard ferro magnetic material of magnetic layer 220 is deposited on top of the soft ferro material of bonding layer 210. However, the hard ferro magnetic material of magnetic layer 220 may be positioned beneath or within the soft ferro material of bonding layer 210. The hard ferro magnetic material is illustrated on the bonding layer 210 as magnetic surfaces 340 and 350 that resemble bar magnets whose polar regions lie in a substantially perpendicular state with regards to the outer edge of the solar energy harvesting strip 110. In other words, the magnetic field of the hard anisotropic ferro magnetic material lies substantially perpendicular to the magnetic field of the soft ferro magnetic material. While it is preferred that the polar regions of the magnetic surfaces 340 and 350 lie in a substantially perpendicular state with respect to the outer edge of the solar energy harvesting strip 110, the magnetic surfaces 340 and 350 may be applied so that their polar regions align in a direction parallel to the solar energy harvesting strip 110. Preferably, the polar regions of adjacent magnetic surfaces 340 and 350 are oriented in opposite directions as shown in FIG. 3A. However, the polar regions of adjacent magnetic surfaces 340 and 350 may be oriented in the same direction. Further, while only magnetic surfaces 340 and 350 are illustrated, it is preferred that the hard ferro magnetic material be applied along most of length of solar energy harvesting strip 110.

The hard ferro magnetic material of magnetic layer 220 generates magnetic fields 320 and 330. The magnetic field strength of the hard ferro magnetic material correlates to the mass of the magnetic material. Accordingly, by way of example, a magnetic field 330 of half strength, as compared to magnetic field 320, is generated at magnetic surface 350 by using a hard ferro magnetic material that is half as thick. Accordingly, any thickness of hard ferro magnetic material may be utilized as required by the application or location. An image charge 360 is generated as a result of the hard ferro magnetic material being in proximity of the soft ferro magnetic material. By way of example, image charge 360 is depicted for the hard ferro magnetic material of magnetic surface 340. The polar regions of the image charge 340 are opposite of the polar regions for the hard ferro magnetic material of magnetic surface 340.

In an exemplary embodiment, as shown in FIG. 3B, in place of the hard ferro material 340, a diagmagnetic material 370 such as bismuth may be substituted. Areas of the soft ferro material 210 that are covered with diagmagnetic material 370 significantly decrease the coercive and inductive forces of the magnetic field 380 generated by the soft ferro material 210 in those areas. Use of these magnetic field modifiers in certain patterns along the along the length of the strip allow information to be encoded in a pattern. Devices that are able to sense the variations of the magnetic field along the length of the strip will thereby be able to ascertain the information. By way of example, for an electric vehicle traveling along the length of the strip, the encoded information may comprise traffic signals, speed limits, driver assist programs, and so forth.

Exemplary Structure of Conductive Layer:

A better understanding of the conductive layer 240 will be achieved through the following detailed discussion with reference to FIGS. 4A, 4B, 4C, 4D, 4E and 4F which illustrate exemplary structures of the conductive layer 240. FIGS. 4A, 4B and 4C illustrate cross-sectional views of the exemplary structures of the conductive layer 240. FIGS. 4D, 4E and 4F illustrate perspective views of the exemplary structures of the conductive layer 240. In FIGS. 4A-4C and 4D-4F, a first conductor 410A, 410B and 410C is spaced apart from a second conductor 420A, 420B and 420C with a dielectric or insulative material 430A, 430B, 430C formed between. When used with a dielectric, the conductors form a parallel plate discharge capacitor. One of the first conductor 410A, 410B and 410C and second conductor 420A, 420B and 420C functions as an electrically positive plate while the other functions as an electrically negative plate. Additionally, dielectric or insulative material may additionally be formed adjacent to any combination of the top, bottom, left or right side of the structures shown in FIGS. 3A-3B. Moreover, any number of the bonding layer 210, magnetic layer 220, thermal harvesting layer 230, conductive layer 240, photonic harvesting layer 250, and sealing layer 260 may be form between the first conductor 410A, 410B and 410C and second conductor 420A, 420B and 420C instead of or in addition to the dielectric or insulative material 430A, 430B and 430C, and may have a cross sectional width that is less than, greater than or equal to the insulative material 430A, 430B and 430C. The cross sectional height for each of the first and second conductors 410A, 410B and 410C and 420A, 420B and 420C and dielectric or insulative material 430A, 430B and 430C are shown as being the same. However, the height of each can vary according to the application. FIGS. 4A and 4B are similar in that first conductors 410A and 410B are situated below the dielectric or insulative material 410A and 410B which is below the second conductor 420A and 420B. FIGS. 4D and 4E are similar for the same reasons as FIGS. 4A and 4B. FIGS. 4B and 4C are similar in that the first conductor 410B and 410C and second conductor 420B and 420C are parallel, spaced apart and at least one of the first conductor 410B and 410C and second conductor 420B and 420C has a cross sectional width less than the width of the strip. FIGS. 4E and 4F are similar for the same reasons as FIGS. 4B and 4C. While FIGS. 4A-4C show particular exemplary structures of the conductive layer 240, conductive layer 240 may be formed in other ways as the application requires.

FIGS. 4A and 4D illustrates conductive layer 240 formed so as to have the second conductor 420A formed on top of the dielectric or insulative material 430A which is formed on top of the first conductor 410A. Each of the first and second conductors 410A and 420A and dielectric or insulative material 430A are substantially planer, with each lying in different planes, and each have substantially the same cross sectional width. However, the first and second conductors 410A and 420A and dielectric or insulative material 430A may also be form so that dielectric or insulative material 430A is narrower than the first conductor 410A but wider than the second conductor 420A.

FIGS. 4B and 4E illustrates conductive layer 240 having parallel spaced apart first and second conductors 410B and 420B formed side by side with the dielectric or insulative material 430B formed in between. Second conductor 420B is formed on top of the dielectric or insulative material 430B which is formed on top of the first conductor 410B. First and second conductors 410B and 420B at least partially lie in different planes. Dielectric or insulative material 430B is continuous and may have a cross sectional width equal to or less than width of the strip. In an alternative implementation, the first conductor 410B may be positioned over the dielectric or insulative material 430B with the second conductor 420B position beneath the dielectric or insulative material 430B. The cross sectional width of at least one of the first and second conductors 410B and 420B is less than the cross sectional width of the strip.

FIGS. 4C and 4F illustrates conductive layer 240 having parallel spaced apart co-planer first and second conductors 410C and 420C formed side by side with a co-planer dielectric or insulative material 430C formed in between. The cross sectional width of each of the first and second conductors 410C and 420C and dielectric or insulative material 430B is less then the cross sectional width of the strip.

FIGS. 4A-4F illustrate particular exemplary structures of the conductive layer 240, however, conductive layer 240 may formed in other ways as the application requires.

Figure 5A:
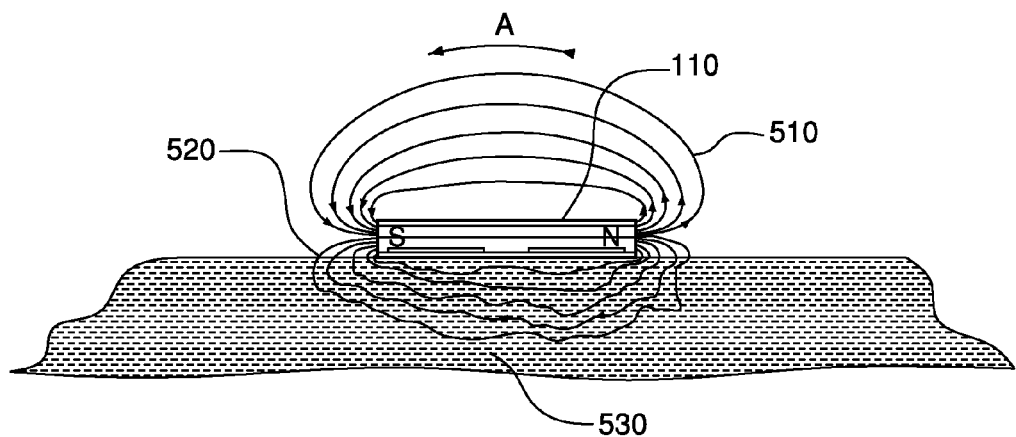
FIG. 5A depicts a cross sectional view of the first exemplary embodiment of the solar energy harvesting strip.
Figure 5B:
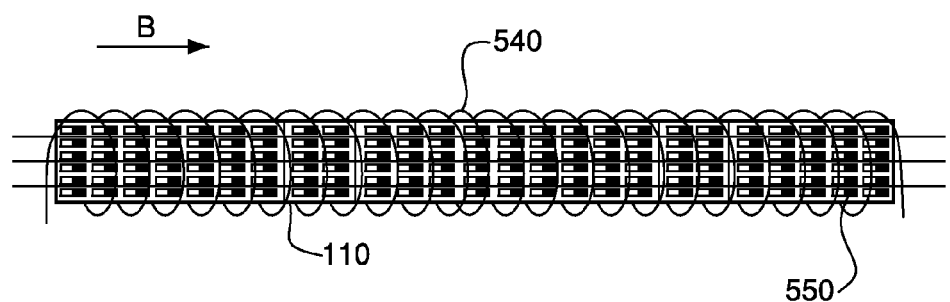
FIG. 5B depicts the magnetic field of the first exemplary embodiment of the solar energy harvesting strip from a top view.

Exemplary Embodiment of Operation of Solar Energy Harvesting Strip:

In order to better understand the operation of the solar energy harvesting strip 110, a study of the magnetic fields of the individual elements is in order. FIGS. 5A and 5B depict the magnetic field lines of solar energy harvesting strip 110 when the layers of the solar energy harvesting composition are in place.

In FIG. 5A, a cross sectional view of the solar energy harvesting strip 110 formed on surface 530 is shown. The magnetic poles of the solar energy harvesting strip 110 are shown in the cross sectional view. Upper magnetic field lines 510 are shown oriented in direction A. Further, lower magnetic field lines 520 are shown passing through surface 530.

In FIG. 5B the orientation of the magnetic field from a top view is shown. As can be seen in this view, the magnetic moments 550 are aligned parallel to the outer edge of the strip and have a magnetic orientation such that their north pole points in direction B. As a result of this method of polarization, a number of small anisotropic regions are created whose net field effect emulates that of a bar magnet. Further, a net field effect of the combined components of the solar energy harvesting strip 110 along the length of the solar energy harvesting strip 110 is a helical field 540 along the length of the solar energy harvesting strip 110. The helical field 540 orientation resembles a torus and the net effect on an unbounded electron is torrisional. This torrisional effect influences electron flow in the solar energy harvesting strip 110.

Figure 6:
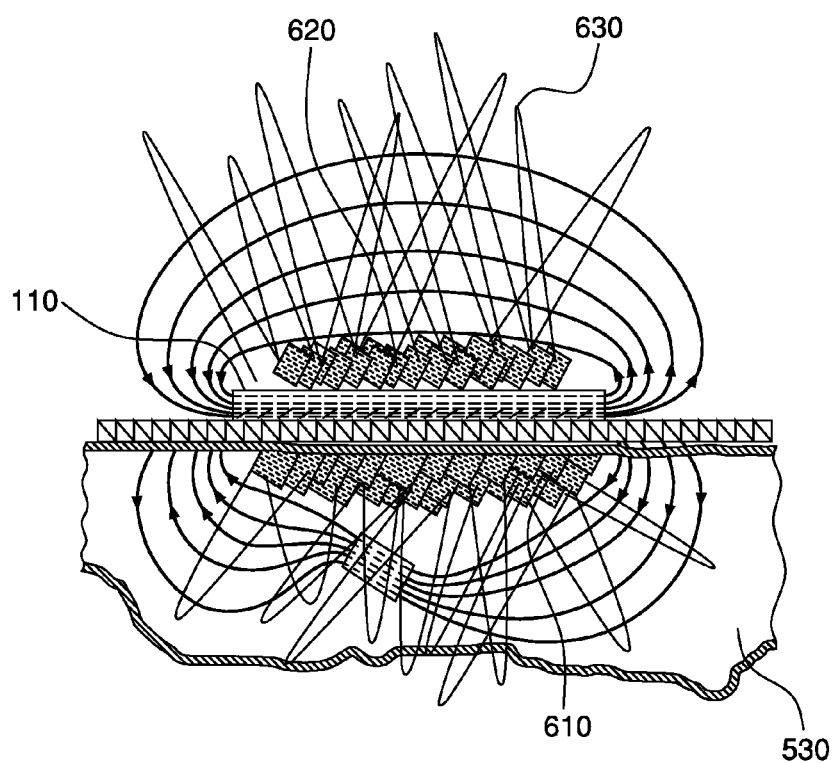
FIG. 6 illustrates a cross sectional view of the first exemplary embodiment of the solar energy harvesting strip including the effects of soft iron deposits on the magnetic field.

The magnetic fields depicted in FIGS. 5A and 5B are merely exemplary and are shown in the absence of any magnetic interference. However, as is exemplified in FIG. 6, soft iron deposits 610 may be located beneath the surface 530 that interfere with the magnetic fields of the solar harvesting strip 110. These soft iron deposits form image charges 620 above the anisotropic permanent magnetic material. As a result, spike lines 630 are created above the magnetic field that are random modifiers of the field at large. In order to facilitate an ease of understanding, the effects of the soft iron deposits 610 located beneath the surface 530 will be omitted from further discussions.

Figure 7:
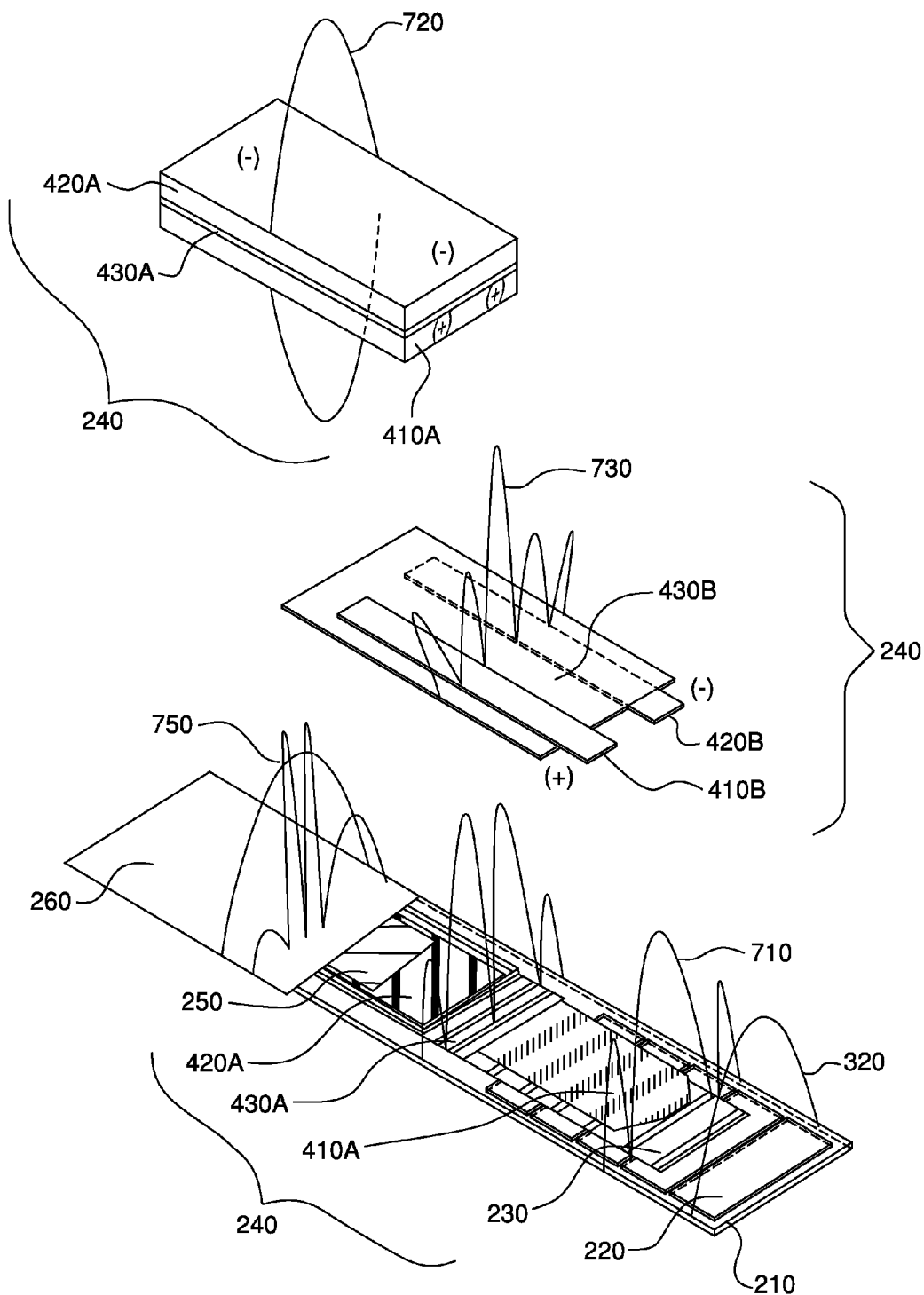
FIG. 7 illustrates the magnetic fields for each of the layers of the first exemplary embodiment of the solar energy harvesting strip.

The individual magnetic fields of the components of solar harvesting strip 110 will now be discussed. FIG. 7 depicts the magnetic field lines for each successive layer including alternative embodiments for conductive layer 240 that are exemplified in FIGS. 4A-4D and 4C-4F. The magnetic field lines for the conductive layers 240 exemplified in FIG. 4B are substantially similar to the magnetic field lines illustrated with respect to FIG. 4C, and therefore a discussion thereof is omitted.

The magnetic field 320 generated by bonding layer 210 and/or magnetic layer 220 has been discussed above with reference to FIG. 3 and therefore any further discussion will be omitted for the sake of brevity. The thermal harvesting layer 230 alters the magnetic field generated by bonding layer 210 and/or magnetic layer 220 and results in altered magnetic field lines 710.

The conductive layer 240 generates a magnetic field when current flows through the conductors. However, the current flow is affected by conductive layer 240 being located within the magnetic field generated by the bonding layer 210 and/or magnetic layer 220. The net effect on electron flow due to the magnetic field generated by the bonding layer 210 and/or magnetic layer 220 is to force the electrons to the outer edges of the conductors. This phenomenon is known in the art as magnetic field line fringing and becomes important when using mono-pole plastics because many of the available electrons become trapped by the atoms of the other constituent elements. The use of an external magnetic field to force electron flow out to the edge of the conductors overcomes the tendency of electrons to be randomized in their migration. The magnetic field generated by the conductive layer 240 increases the net magnetic field strength due to the electromagnetic force in the conductors. Thereby, the potential of the magnetic inductance field is increased.

The magnetic fields generated around the conductors of the conductive layer 240 vary according to the structure of the conductive layer 240. By way of example, exemplary conductive layers 240 of the embodiments shown in FIGS. 4A-4D and 4C-4E are depicted in FIG. 7.

In the conductive layer 240 of the type exemplified in FIGS. 4A and 4D, magnetic field lines 720 follow a circular pattern around the flat conductors. A spike in the magnetic field strength occurs at the midpoint of the separation between the two conductors. However, when saturation occurs, the spike collapses at the meridian and forms in the direction of the current flow in the conductors.

In the conductive layer 240 of the type exemplified in FIGS. 4C and 4E, magnetic field lines 730 reach a max spike at the center of the max distance between the two conductors that are separated by a dielectric. A secondary field spike occurs between the anisotropic and dielectric material at the midpoint between the two conductors.

The dielectric of the conductive layer 240 further results in a modified magnetic field 740 which is a magnetic field of the bonding layer 210 and/or magnetic layer 220 which has been modified by the thermal harvesting layer 230.

When all the layers of energy harvesting strip 110 are in place, the magnetic fields of the various conductors and the magnetic layers produce a linear magnetic field 750 that follows the right hand rule of field direction when there is a current present in the conductors.

Figure 8:
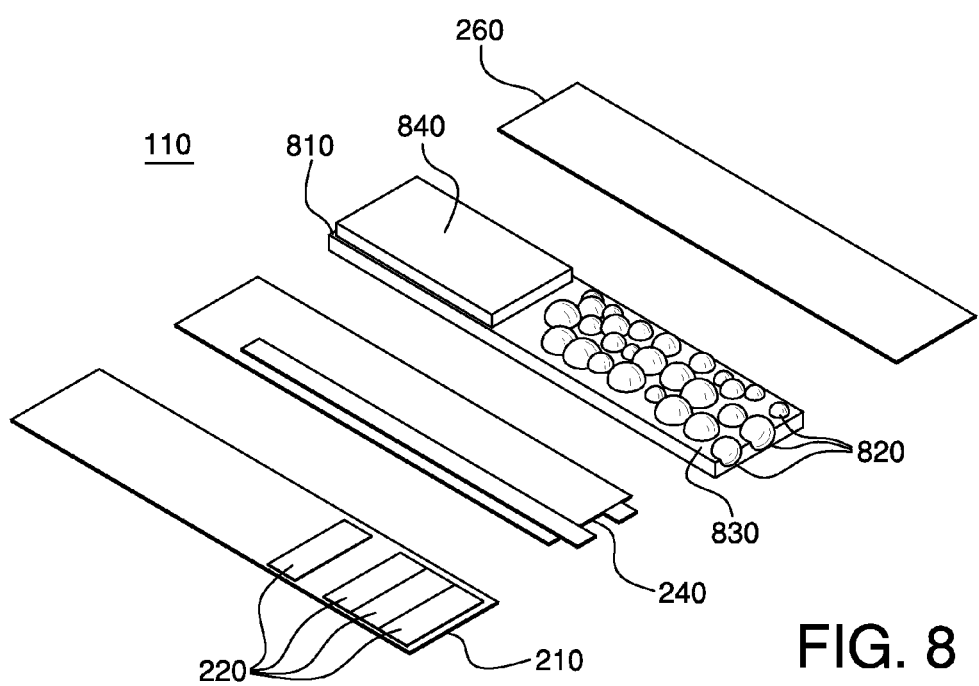
FIG. 8 illustrates a second exemplary embodiment of the solar energy harvesting strip in elemental form.

Second Exemplary Embodiment of Solar Energy Harvesting Strip:

A second exemplary embodiment of the solar energy harvesting strip 110 in elemental form is illustrated in detail in FIG. 8. The solar energy harvesting device, according to the second exemplary embodiment, comprises a second multiple layer solar energy harvesting composition comprising a bonding layer 210, a magnetic layer 220, a conductive layer 240, a thermal-photonic harvesting layer 810, and a sealing layer 260. When the components of the thermal-photonic harvesting layer 810 are combined as shown in FIG. 8, they form N type solid state junction diodes. These components are shown and arranged as one example, and in other embodiments of the present invention, components can be combined, added, removed and/or rearranged as required by the application or location. In FIG. 8, the energy harvesting strip 110 is embodied as a strip, but may be formed in any configuration as required by the application or location. Further, all of the layers may be formed having the same width or the layers may be formed such that each layer positioned on top of another layer is narrower than the layer beneath it. Still further, the edged of any of the layers may be squared, rounded, or tapered. In the second exemplary embodiment, bonding layer 210, magnetic layer 220, conductive layer 240, and sealing layer 260 are identical to their respective layer in the first exemplary embodiment, and a description thereof will be omitted. It is further noted that thermal harvesting layer 230 and/or photonic harvesting layer 250, as described with respect to the first exemplary embodiment, may be provided in the second exemplary embodiment.

In operation, the thermal-photonic harvesting layer 810 converts thermal and/or photonic energy into electrical energy. When a conductive layer 240 is included, the electrical energy migrates to the conductive layer 240 under the influence of a magnetic field generated by the magnetic layer 220 and/or bonding layer 210. Conductive layer 240 stores the electrical energy and generates an electric field which augments the magnetic field. Further, conductive layer 240 may be attached to an electrical energy consumption, transmission and/or storage device. When the energy harvesting composition is embodied as a strip and conductive layer 240 is attached to an electrical energy consumption, transmission and/or storage device, one or more attachments may occur along the strip.

When a conductive layer 240 is not included, electrical flow occurs within and/or between the layers and generates an electric field which augments the magnetic field. With or without conductive layer 240, the augmented magnetic field couples the energy harvested by the thermal harvesting layer 230 and/or photonic harvesting layer 250 to an electric vehicle and/or other remote devices. In another embodiment, the electrical energy is used to energize inductive coils that are used to couple the energy harvested by the thermal-photonic harvesting layer 810 to an electric vehicle and/or other remote devices. A better understanding of the first exemplary embodiment of the solar energy harvesting strip 110 will be achieved through the following detailed discussion.

As shown in FIG. 8, thermal-photonic harvesting layer 810 comprises a doped silicate barrier solution layer 830, a clear N type silicate barrier layer 840 and a plurality of nanostructures. In an exemplary embodiment of the present invention, the nanostructures are 60 sided carbon buckyballs 820. Preferably, at least a portion of the lower hemisphere of the buckyballs 820 is suspended within the doped silicate barrier solution layer 830 and at last a portion of the upper hemisphere of the buckyballs 820 is suspended within clear N type silicate barrier layer 840. Buckyballs 820 carry a structurally negative charge, and therefore are preferable for forming solid state junction diodes of the NPN type.

The buckyballs 820 are situated in the thermal-photonic harvesting layer 810 such that electrical fields generated by the buckyballs 820 align in a perpendicular manner with respect to the magnetic field produced by the magnetic layer 220 and/or bonding layer 210. The individual buckyball structures generate electrical flow, behaving like parallel plate discharge capacitors in series. Because electrical fields generate magnetic fields, the field strength of the solar energy harvesting strip 110 will be augmented.

The buckyballs 820 have had solid state junction diodes formed on the facets of their exterior structure for the conversation of thermal and/or photonic energy into electrical energy which is discharged into the solar harvesting strip 110. In order to convert the thermal and/or photonic energy into electrical energy, thermal and/or photonic energy harvesting materials are deposited on the facets of the buckyball 820. The thermal and photonic energy harvesting materials could be any of the material discussed above with respect to the thermal harvesting layer 230 and photonic harvesting layer 250 of FIG. 2. Further, the photonic energy harvesting material could include doping the facets of the buckyball 820 with nanocrystals that are doped by any number of dopants, such as germanium, phosphorous and boron, and the like. Preferably, a lower hemisphere of the buckyballs 820 comprises the thermal harvesting material and an upper hemisphere of the buckyballs 820 comprises the photonic energy harvesting material. However, the thermal and photonic energy harvesting materials may be comprised on any of, and include any number of, the facets of the buckyballs 820. Moreover, buckyballs 820 may comprise only thermal or photonic energy harvesting materials. Additionally, any combination of thermal only, photonic only and mixed thermal-photonic buckyballs 820 may be utilized. The buckyballs 820 are prepared by conventional methods known to the art.

Preferably, the facets of the buckyballs 820 comprise spacing between the applications of thermal and/or photonic harvesting material so as to provide excellent electron path migration. The advantages of cutting channels in silicon for electron migration occurs naturally in this structure.

The structure of the buckyballs 820 are advantageous in that when applied to the solar harvesting strip 110, they have up to 30 facets that face the sky at every angle to catch sunlight from dusk to dawn, thereby eliminating the need to constantly reorient solar cells. While embodiments of the present invention are described utilizing 60 sided carbon buckyballs 820, epoxy and carbon microballs could be substituted for the buckyballs 820. For example, hollow carbon microballs with a dielectric having poles formed from nanotubes would substantially perform the same function as the buckyballs.

Figure 9:
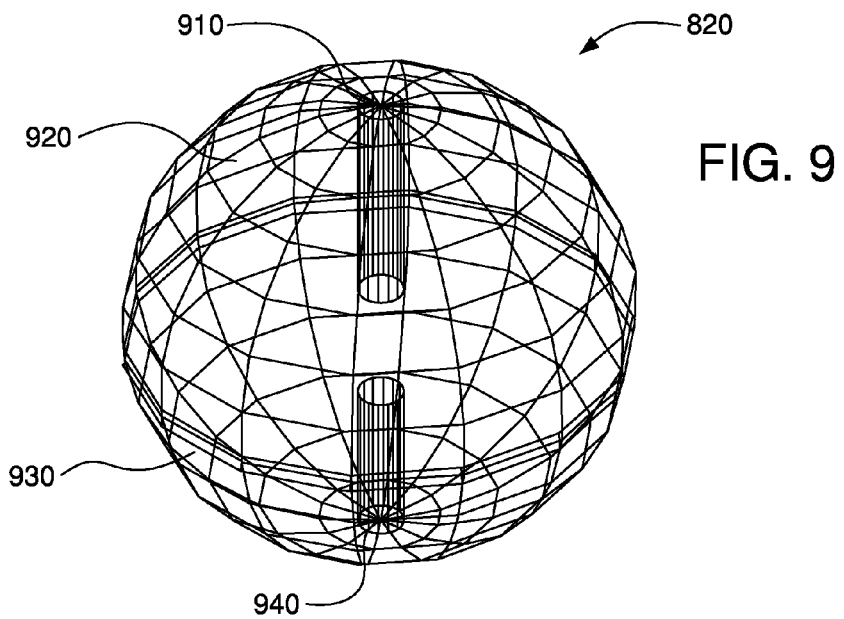
FIG. 9 illustrates an exploded view of a first exemplary embodiment of a buckyball for use with the second exemplary embodiment of the solar energy harvesting strip.

First Exemplary Embodiment of a Buckyball:

FIG. 9 illustrates a first exemplary construction of a buckyball 820 of the thermal-photonic harvesting layer 810 according to an exemplary embodiment of the present invention. In FIG. 9, a carbon nanotube 910 is located in the upper hemisphere 920 of the buckyball 820 and functions as an electrode for the buckyball 820. The nanotube 910 comprises a hollow interior and may contain silicon nanocrystals and/or a magnetic material within its hollow interior. FIG. 9 further illustrates a second electrode 930 at a lower hemisphere of the buckyball 820. Depending on the composition of the buckyballs 820 they may operate as either a nanobattery or a nanocapacitor.

When buckyballs 820 are formed as a nanobattery the buckyballs are filled with an electrical energy storing chemical and are provided with the carbon nanotubes 910 and 940 to form a nanobattery. These nanobatteries use thermal and/or photonic energy to produce electricity, which is discharged into solar energy harvesting strip 110, then recharged and discharged repeatedly. In an exemplary embodiment of the invention, the rate of discharge and recharge is on the order of millions of times a second.

When the buckyballs 820 are formed as nanocapacitors, the buckyballs 820 comprise the tuned carbon nanotubes 910 and 940 and a dielectric material introduced to the interior of the hollow carbon structure. Exemplary dielectric materials include tantalum pentoxide ($Ta_2O_5$) and manganese dioxide ($Mno_2$). However, any other dielectric material may be used. When tantalum pentoxide ($Ta_2O_5$) and/or manganese dioxide ($Mno_2$) is used as the dielectric material, the buckyball 820 is formed as a nanoelectrolytic nanocapacitor. When buckyballs 820 are formed as a nanocapacitor they use thermal and/or photonic energy to produce electricity, which is then discharged into the solar harvesting strip 110.

Figure 10:
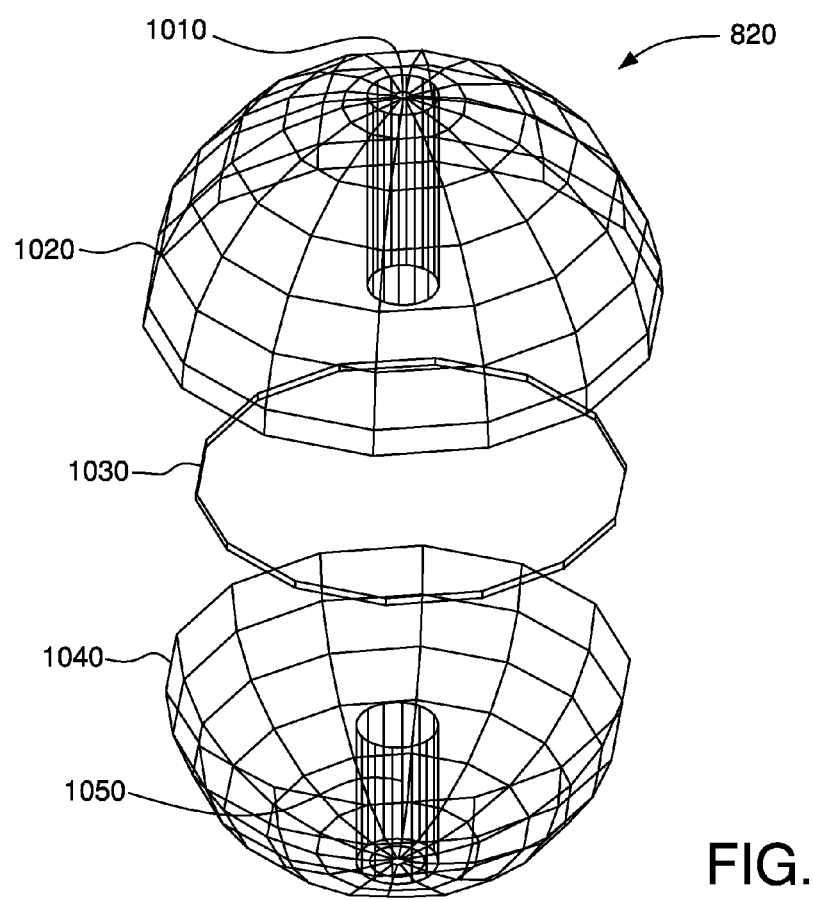
FIG. 10 illustrates an exploded view of a second exemplary embodiment of a buckyball for use with the second exemplary embodiment of the solar energy harvesting strip.

Second Exemplary Embodiment of a Buckyball:

FIG. 10 illustrates a second exemplary structure of carbon buckyball 820, which is illustrated in a partially exploded view. In FIG. 10, a tuned carbon nanotube 1010 is located at the upper pole of an upper hemisphere 1020 of the buckyball 820. Further, a tuned carbon nanotube 1050 is located at a lower pole in the lower hemisphere 1040 of the buckyball 820. Additionally, a carbon barrier 1030 is equatorially placed within the hollow center of the buckyball 820. Carbon barrier 1020 preferably comprises a coating of a dielectric material that serves as a collection medium for electrons flowing into the solar energy harvesting strip 110.

Figure 11:
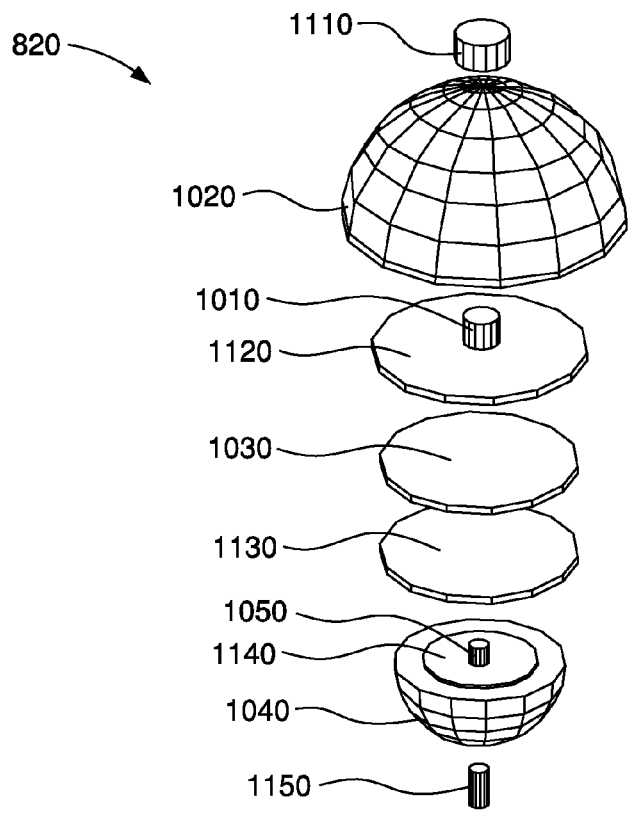
FIG. 11 illustrates a detailed view of the second exemplary embodiment of the buckyball illustrated in FIG. 10.

FIG. 11 illustrates a comprehensive exploded view of the second embodiment from FIG. 10 shown in greater detail. A dielectric coating 1120, is located on the upper side of barrier 1030. An exemplary dielectric coating includes tantalum pentoxide, however any other dielectric material could alternatively be used. Barrier 1030 further comprises a dielectric coating 1130 on the bottom of the barrier 1030. Dielectric coating 1120, barrier 1030 and dielectric coating 1130 perform the function of a parallel plate discharge capacitor with a high leakage rate.

As illustrated in FIG. 11, tuned carbon nanotube 1010 functions as an electrode with anode and cathode termination points. The nanotube 1010 exits the carbon structure of buckyball 820 at the upper pole and includes a protruding portion 1110 with a cathode termination point. Further, carbon nanotube 1010 includes an anode termination point located at dielectric coating 1120. Protruding portion 1110 illustrates an exemplary length for the portion of nanotube 1010 exiting the buckyball 820. Likewise, tuned carbon nanotube 1050 functions as an electrode with anode and cathode termination points. The nanotube 1050 exits the carbon structure of buckyball 820 at the lower pole and includes a protruding portion 1110 with an anode termination point. Further, carbon nanotube 1050 includes a cathode termination point located at dielectric coating 1130. Protruding portion 1150 illustrates an exemplary length for the portion of nanotube 1050 exiting the buckyball 820.

In operation, electrical field charges migrate to the exterior of the buckyball 820. Alignment of electrical field lines occurs at the dielectric coating 1120 which functions as a collection plate for the anode termination point of nanotube 1010 and thereby carries a net negative charge which saturates the barrier 1030. The barrier 1030 is also saturated by dielectric coating 1130 which functions as a collection plate for the cathode termination point of nanotube 1050 and thereby carries a net positive charge.

A magnetic material 1140, whose field is opposite of the magnetic field of the magnetic layer 220 and/or bonding layer 210, is shown filling the hollow portion of the lower hemisphere of the buckyball 820. The purpose of the magnetic material 1140, according to an exemplary embodiment of the present invention, is to orient the buckyball 820 so that facts comprising the photonic harvesting material are oriented upward. For example, if the nanostructure 820 is being sprayed upon a surface, the magnetic material 1170 within the sphere is attracted to the magnetic material in bonding layer 210 and/or magnetic layer 220 and rotates the sphere to a proper or desired orientation. Magnetic material may also be deposited in the hollow anode as well. To further ensure alignment, a diamagnetic material may be placed in the cathode.

As noted above, the individual buckyballs 820 generate electrical flow, behaving like parallel plate discharge capacitors in series. Because electrical fields generate magnetic fields, the magnetic field strength of the solar energy harvesting strip is augmented for inductance. The electrons flow to the conductive layer 140 which itself acts as a parallel plate capacitor.

First Exemplary Embodiment of a Method of Application of a Solar Energy Harvesting Composition In another exemplary embodiment of the present invention, the solar energy harvesting strip comprises a solar energy harvesting composition for use with an applicator to spray apply the layers of the solar energy harvesting composition on a driving surface. The solar energy harvesting composition comprises about 10% to about 20% rubber type adhesive to act as bonding agent between the driving surface and subsequent applications, about 20% to about 60% magnetic material, about 20% to about 40% specially prepared solid state junction diodes, a conduction material where used comprise about 20% to about 30% graphite/epoxy and about 20% to about 30% of a metallic conductor such as Aluminum Dioxide. The film is then sealed by a type of transparent material, such as a transparent TEFLON material. These layers can be configured and arranged in a number of manners. For example, a permanent magnet rubber bonding strip can be applied, followed by a first and second conductor application, an epoxy/graphite dielectric conduction strip, a thermal electric converter, a photonic energy harvesting material conduction film, and completed with a clear topcoat. In another example, an aluminum dioxide plate conductor can be applied, followed by a graphite/epoxy dielectric, an aluminum dioxide plate conductor, barium strontium titanates, a photonic energy harvesting material conduction film, and completed with a clear nonstick topcoat. In the above examples, thermal energy harvesting materials may substituted for any of materials or be separately applied.

Second Exemplary Embodiment of a Method of Application of a Solar Energy Harvesting Composition Use of an apparatus such as the one disclosed in U.S. Pat. No. 5,605,251 of Retti entitled "Pulseless Pump Apparatus", the entire disclosure of which is incorporated herein by reference, is preferable for applying the chemical coating of yet another embodiment of the present invention, in three somewhat simultaneous overcoatings. In the first application, a rubber-based, asphalt cement which combines permanently magnetized material, preferably about 75% magnetic material to about 25% cement, is applied to the surface providing electrical insulation as well as a bonding agent for the subsequent overcoatings. In a somewhat simultaneous application, graphite, preferably in a solution of 65% graphite 65%, and 35% epoxy or ACC (superglue), is applied to the bonding agent in two separate but parallel lines to form conductors representing the positive and negative leads in a circuit. In the third application of material, specially formed solid state junction diodes are deposited by air jet onto the surface of the magnetic-graphite strip, forming a solid overcoating of the base materials producing photovoltaic strips on the surface of the road. A final deposition comprised of PFTEE can then be achieved by direct spray onto the surface of the strips, so as to protect the composition from the effects of the elements. In the above example, thermal energy harvesting materials may substituted for any of materials or be separately applied.

Exemplary Short Capture Energy System:

In yet another embodiment of the present invention, an energy system can be provided and is referred to for purposes of discussion as a short capture energy system. The short capture energy system comprises installing a solar energy harvesting strip in a road surface under a protective coating that electric vehicles may use to recharge onboard batteries by means of an inductive coupling. The solar cells used in the short capture energy system, according to yet another embodiment of the present invention, are basically the same PNP gates formed on silicon wafers that are in use today. The short capture energy system is different in that after the formation of the gates, the product is bonded with a rubberized magnetic material and then ground or broken up so as to be air blasted onto a rubber based adhesive strip previously applied to a driving surface. A magnet is then passed over the solution so as to "flip" the cells so that the gates are upward and form a fractal surface pointed skyward.

After the cells are oriented correctly, a PFTEE coating is liquid applied to the surface creating a protective coating that passes more sunlight in the coned spectrum then does glass. No conductor is needed since the cells will only capture the current for a short period before release to the onboard auto batteries by means of induction. Given the expansion rates of concrete as well as asphalt, the normal fissuring of these surfaces will harmlessly translate to the strip surface without effect as there is no need to maintain a continuous conductor. The gates may be broken, cut, or ground to any shape with the embodiment being triangular shaped silicon gates bonded to rubberized magnetic material. In the above example, thermal energy harvesting materials may substituted for any of materials or be separately applied. Alternatively, the materials, layers, and/or composition of the first and second exemplary embodiments of solar energy harvesting strip may be formed and/or operate according the small capture energy system.

Exemplary Small Capture Energy System:

In yet another embodiment of the present invention, an energy systems can be provided and is referred to for purposes of discussion as a small capture energy system. The small capture energy system involves the use of a material similar to that describe above with respect to the solar energy harvesting strip 110. However, instead of a driving surface, the solar energy harvesting composition is applied to the separation walls found on highways. Further, it utilizes a continuous conductor that will allow the photonic and/or thermionic energy harvesting materials to pass and store electricity for a variety of uses. The electricity of a 6 inch solar energy harvesting strip on all of the existing driving surfaces as well as on the barrier walls, would out produce all the current solar capture devices in use today.

In the small capture energy system, a rubber type cement is applied, for example, to the surface of barrier walls on the highway. However, the composition could alternatively be applied to rooftops, bridges, light poles, and so forth, onto which a conductor could be applied. Over the conductor, a coating of an electrolytic epoxy is sprayed while receiving a somewhat simultaneous application of the solar cells. Like the short capture energy system, a magnet is used to orient the PNP gates skyward. The strips of cells could be linked together to run a variety of applications. Alternatively, the materials, layers, and/or composition of the first and second exemplary embodiments of solar energy harvesting strip may be formed and/or operate according the small capture energy system.

Exemplary Use of Small and Short Capture Energy Systems:

Exemplary embodiments of the present invention could be used to charge vehicle batteries. For example, solar harvesting strips 110 can be installed in parking lots. The solar harvesting strips 110 could be laid out in a parking lot on space dividers to determine field generation strength as well as basic durability. These strips could be comprised of the small capture energy system embodiment, having continuous conductors tied to collection batteries. Vehicles having electric batteries could charge at these stations. Further, solar harvesting strips 110 could be applied on major highways. Additionally, solar harvesting strip 110 could be applied to the separation wall, that is, the concrete barrier between lanes, and tied to a continuous conductor including collection batteries to run highway lights, lighting for signs, and so forth. Once in place and operating, the small and short capture energy systems can be utilized to augment the solar harvesting strip 110.

Third Exemplary Embodiment of the Method of Application of Solar Energy Harvesting Material In yet another exemplary embodiment of the present invention, any ferris metal capable of magnetization can be ground to the consistency of iron filings. Preferably, ferris metal is comprised primarily of reclaimed recyclables. These metals can be generally magnetized by field polarization in this process. Once magnetized, the material can be combined with an electrolytic substance while receiving a somewhat simultaneous overcoating of thermal and/or photonic harvesting materials. Encasement can be finalized by an application of a film. Flow of current through the solar energy harvesting composition would augment the field produced by the already magnetized layer. Since there is a layer of magnetic material, times of little or no sunshine, ice, dirt, and nighttime, would have less of an affect on the system than they would on conventional photovoltaic cell systems. The solar harvesting strips of this composition can receive field augmentation in the energy system. In an exemplary system, the same type of laminations can be used, with the exception of providing a continuous conductor, so that the current flow could be directed to either collection batteries or directed to the roadway strips. Further electrical energy from the collection batteries and/or electric grid my add electricity of the conductors so as to augment the magnetic field.

In such applications, the thermal and/or photonic harvesting materials are basically applied in a suspended solution. In an exemplary embodiment, the application to the road surface can be a four step process that can be accomplished simultaneously from a truck bearing the proper equipment. The application can be much like painting lines on the road. The conducting strips can be applied in much the same way, except that conductors for collection are used. Possible uses for this composition would be barrier walls, the inside of guard rails, jackets for over head wires, and so forth. Since the substrate may be dyed or colored, the lines dividing the lanes on a road could be "repainted" with the material and be made to be conducting or nonconducting.

A use of the above embodiments further comprises uses on rooftops. The same materials for the road can be used to coat existing rooftops. Further, instead of collecting voltage from a dense concentration of cells, collection of the magnetic field is possible to drive a small generator by magnetic inductance.

Further Exemplary Embodiments

In yet other embodiments of the present invention, an indestructible solar cell can be designed to be embedded in the roadway and provide a system and method of power generation for electrical vehicles by use of electrical inductance principles, whereby the vehicles passing over the cells may draw current from them for onboard charging of fuel cells. The embodiments can further comprise a system and method for a digital, as well as a fiber optic network, allowing the concurrent construction of a global communications network. Also, the embodiments can comprise a system and method for recharging and discharging the related network so as to produce an electrical surplus, which may be used to power any and all foreseeable technologies which use electricity. The thermal and/or photonic harvesting materials of the embodiments may also be used in general housing construction applications, as the surface of these solar cells may be constructed to resemble any surface such as shingles, bricks, siding, glass films, and so forth. Further. the embodiment can comprise a method of photo nonreluctant dying so that the solar cells may be dyed without consequence to the cells electrical conducting properties. Also, the embodiments can further comprise a method of photoluminescence magnification to multiply the net effect of the charging cycle by a factor of 4 to produce ultra efficient charging, and include a system and method for lighting the roadway at night with little consequential discharge of the network.

An application of an embodiment of the present invention can entail installation of conventional photovoltaics on the surface of barrier walls, guard rails, and so forth. Methods of doing this have been devised so as to be able to transfer electrical current to ferris bearing substrates attached to the road surfaces via electrical coils to create magnetic fields. Electric cars can then be provided having an inductive coupling device attached to the subframe, and which are tied electrically through diodes to an onboard charging device. Since the charging medium is a long range magnetic field, having an inductive coupling device that is maintained at certain heights with regards to the charging medium is not as necessary as it is for a short distance charging system, such as buried electrical cable in the roads.

In another exemplary embodiment of the present invention, the introduction of thermal and/or photonic harvesting materials bonded to any type of magnetic material via the use of electrolytic material such as certain epoxies, can occur. Like the first application, a film of rubber and a Ferris substrate would precede the application of an electrolytic and photovoltaics covered over by a film of PFTEE that passes more of the correct wavelength than does glass. Provisions can then be made to use augmentation by photovoltaics. Application of the photovoltaics to the substrate can yield a Fractal surface, proven to be more effective at wave length capture than a flat or parabolic conformity.

In yet another exemplary embodiment of the present invention, the composition could be air blasted onto a quick setting solution that would contain all conductors and/or magnetic material in the solution. Magnetic field orientation could be a one time process by passing a magnet over the solar harvesting strips. If the gates are bonded to a magnetic material on the negative side of the gates, positive gate orientation could be accomplished by passing a magnet over the semi-viscous strip to orient the gates upwards.

Exemplary Embodiment of the Inductively Coupled Electric Vehicle

Figure 12:
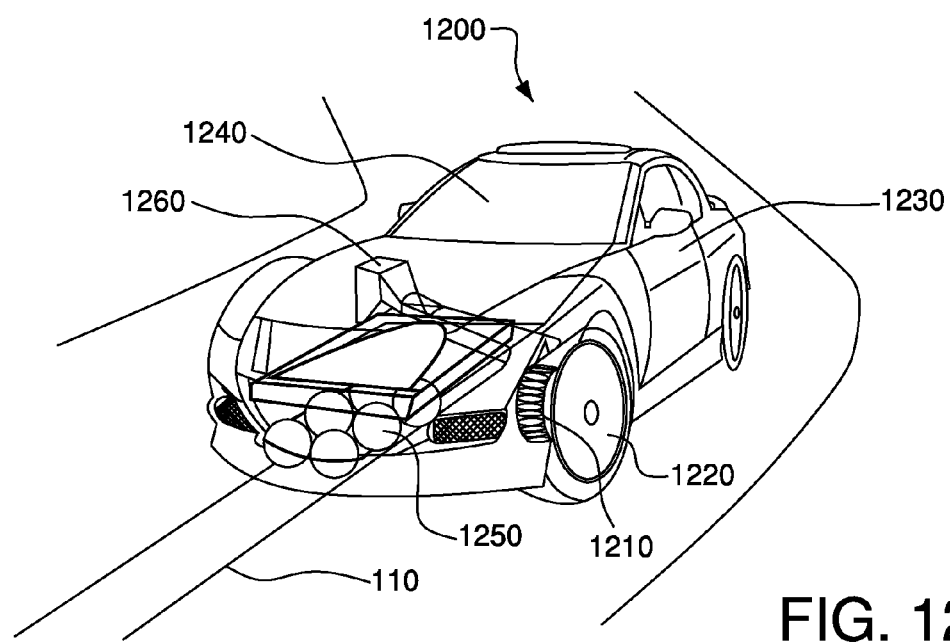
FIG. 12 illustrates an electric vehicle according to an exemplary embodiment of the present invention.

In FIG. 12, an electric vehicle 1200 is illustrated that is operable with the solar energy harvesting strip 110, according to an exemplary embodiment of the present invention. Electric vehicle 1200 may comprise a number of features that increase its efficiency. For instance, electric vehicle 1200 may comprise a regenerative braking system 1210. A regenerative braking system 1210 generates electrical energy by converting breaking force into electrical energy that may be used to power the electric vehicle 1200. Further, electric vehicle 1200 may incorporate independent electric motors 1220 at each wheel. The configuration of having one electric motor at each wheel minimizes the vehicle's weight thereby reducing the amount of energy needed to propel the vehicle. The body panels 1230 may be constructed to function as parallel plate discharge capacitors. Further, a solar energy harvesting material that converts photonic and/or thermal energy into electricity may be used for the finish coating on all body panels 1230. Additionally, all of the window glass 1240 may be coated with a clear or tinted photonic and/or thermal energy harvesting material. Further, electric vehicle 1200 includes an inductive coupling device 1250 which uses a sphere-type inductive coupling device for induction instead of a conventional plate-type inductive coupling device. Preferably, electric vehicle 1200 includes ancillary or backup electrical generation devices. Such ancillary or backup electrical generation devices may covert mechanical motion associated with the electric vehicle 1200 into electricity. For example, when you open the door, a magnetic rod travels through a series of windings which produces electrical current. In addition, the regenerative braking system 1210 described above is another example of an ancillary or backup electrical generation device. Further, electric vehicle 1200 may be provided with a hydrogen motor 1260 that generates electricity. Electric vehicle 1200 may further include channels to collect rain water stored and used by hydrogen motor 1260. Still further, electric vehicle 1200 may be provided with photonic harvesting material underneath the chassis to allow for the conversion into electricity of photonic energy received from lights sources that are coupled to solar energy harvesting strip 110. The light sources may be embedded in the driving service 120 and/or solar energy harvesting strip 110. While electric vehicle 1200 may include all of the above features, electric vehicle 1200 may alternatively include any combination of any number of the above features as well as other features that increase its efficiency.

Figure 13:
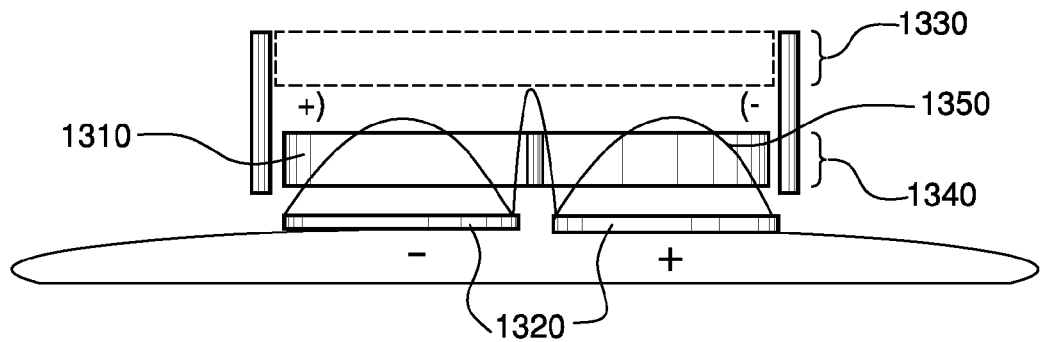
FIG. 13 illustrates a conventional induction coupling device.

A conventional plate-type inductive coupling device is illustrated in FIG. 13. In operation, the conventional plate-type inductive coupling device uses flat metal plates 1310 that must be lowered from a raised position 1330 to a lowered position 1340 so as to be placed in the field 1350 of charging medium 1320 in order to cause current flow across the surface of the plates 1310. This configuration has a number of disadvantages, including potential damage to the plates due to snow, ice, debris or the like. This configuration is further problematic in that the plates 1310 must be centered over the charging medium 1320 for maximum inductive coupling.

Figure 14:
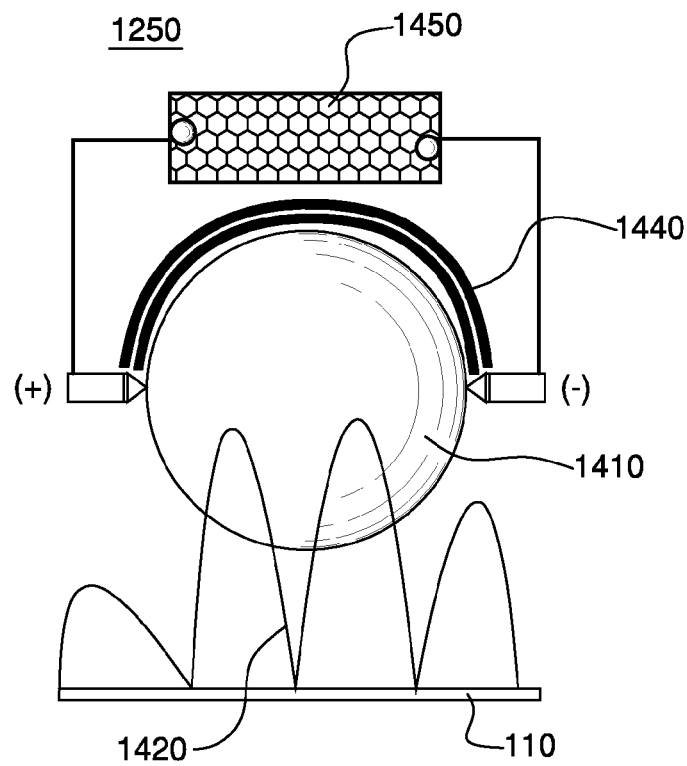
FIG. 14 illustrates an induction coupling device according to an exemplary embodiment of the present invention.

A sphere-type inductive coupling device 1250 according to an exemplary embodiment is shown in FIG. 14. The inductive coupling device 1250 includes an inductance sphere 1410 that does not need to be raised or lowered and so may be fixed at a permanent height well above the charging medium. A sphere-type inductive coupling device is beneficial in that it has a far greater surface area than a plate-type inductive coupling device. The inductance sphere 1410 may be made of a great range of materials including any, or any combination of, soft or hard magnetic materials, dielectric materials and electo-conductive materials. Further, any type of motor, including a hydrogen motor or small internal combustion engine, may be used to spin the inductance sphere 1410 for the generation of electrical energy. When the inductance sphere 1410 is spun in the field 1420 over the solar energy harvesting strip 110, the inductance sphere 1410 accumulates a charge on its surface which in turn is transferred to the battery/storage area 1450. The inductance sphere 1410 accumulates a charge on its surface by inductance through the coil of conductors 1440 around its center. Thus, if the battery storage areas 1450 are low in charge and the vehicle is not moving, the inductance sphere 1410 may be spun to charge its batteries.

Figure 15:
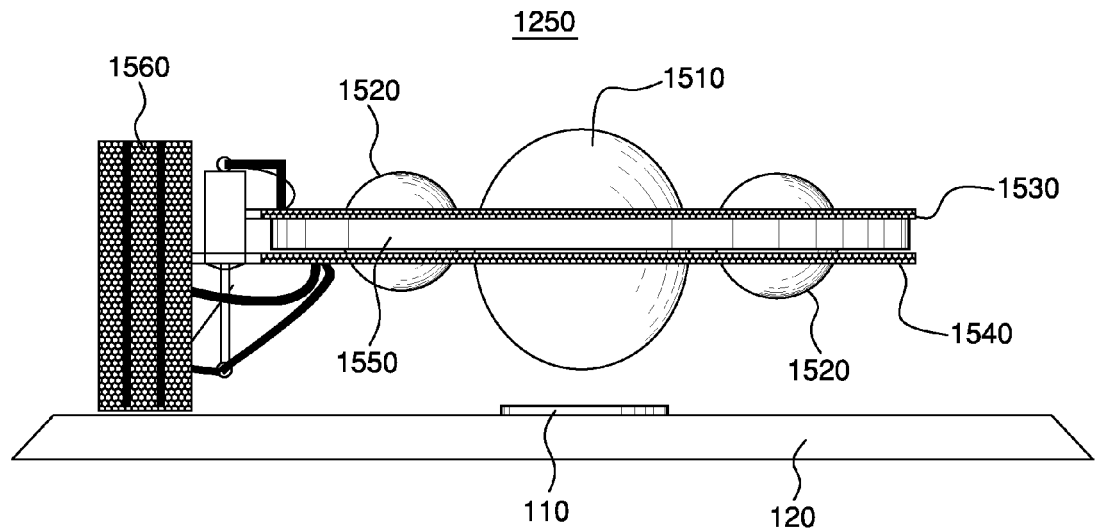
FIG. 15 illustrates an induction coupling device according to another exemplary embodiment of the present invention.

The use of multiple spheres of the same size or of different sizes results in the ability to multiply the charge effect over a large area no matter what the vehicle's position is in relation to the solar harvesting strip 110. In one exemplary embodiment illustrated in FIG. 15, a large sphere 1510 comprised of magnetic material is surrounded by several smaller spheres 1520 comprised of a dielectric material. The larger sphere 1510 may be attached to motorized or mechanical movements causing them to spin. In yet another exemplary embodiment, several large spheres may be used instead of a single large sphere. When the storage capacity of the vehicle is saturated, a super corona discharge may reintroduce charge to the solar harvesting strip 110. Thus, a vehicle 1200 coated with a solar energy harvesting material, sitting in the sun will collect a charge up to its storage capacity. The excess charge will be discharged to the solar energy harvesting strip 110. Furthermore, electrical current will be introduced across the surface of the small inductance spheres when the large sphere 1510 is spun. The net effect on the small dielectric spheres 1520 will be to cause a predominate charge on the faces that will discharge into the solar energy harvesting strip 110, causing a point of charge accumulation that will increase the overall electric charge on the conducting layer 130. This in turn will increase the overall magnetic field of the solar energy harvesting strip 110 that is available for charging. This arrangement provides a means for vehicle charge sharing. For example, a vehicle sitting in a traffic jam with a full charge may increase the magnetic field available for the motorist in front or behind him who may not have a full charge.

The spheres will preferably be constructed as part of a permanent chassis of the vehicle 1200. The chassis will be formed like a parallel plate discharge capacitor with positive 1530 and negative 1540 plates and a dielectric or electrolyte material 1550 in between. Positive plate 1530 and negative plate 1540 are connected to the primary storage batteries 1450 as well as capacitors in the body panels 1230. Additionally, any backup or ancillary electrical generation devices could be electrically coupled to the chassis for providing electrical charge to the chassis. For example, an electrical generating tire 1560, discussed below, could be electrically coupled to the chassis. In an exemplary embodiment of the chassis, the chassis is a carbon fiber filament enclosure surrounding the negative plate 1540. As the spheres 1510 and 1520 accumulate charge, the positive charges will be attracted to the negative plate 1540, and the negative charges will flow to the positive plate 1530. Excess charges will accumulate across the dielectric material and migrate to the negative electrode of the battery 1430 creating a current. When all the storage systems reach saturation, the current will flow to ground, in this case, the solar harvesting strip 110.

Figure 16:
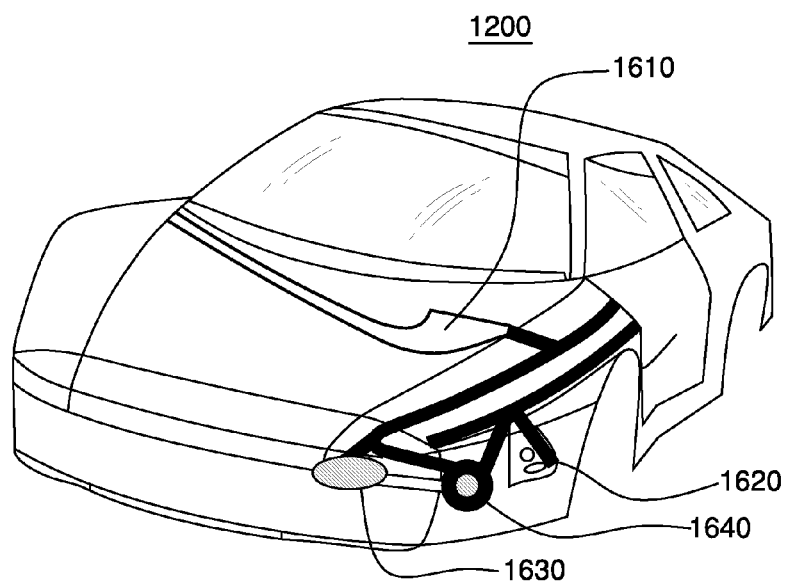
FIG. 16 illustrates conductions lines on the body panels of the electric vehicle according to an exemplary embodiment of the present invention.
Figure 17:
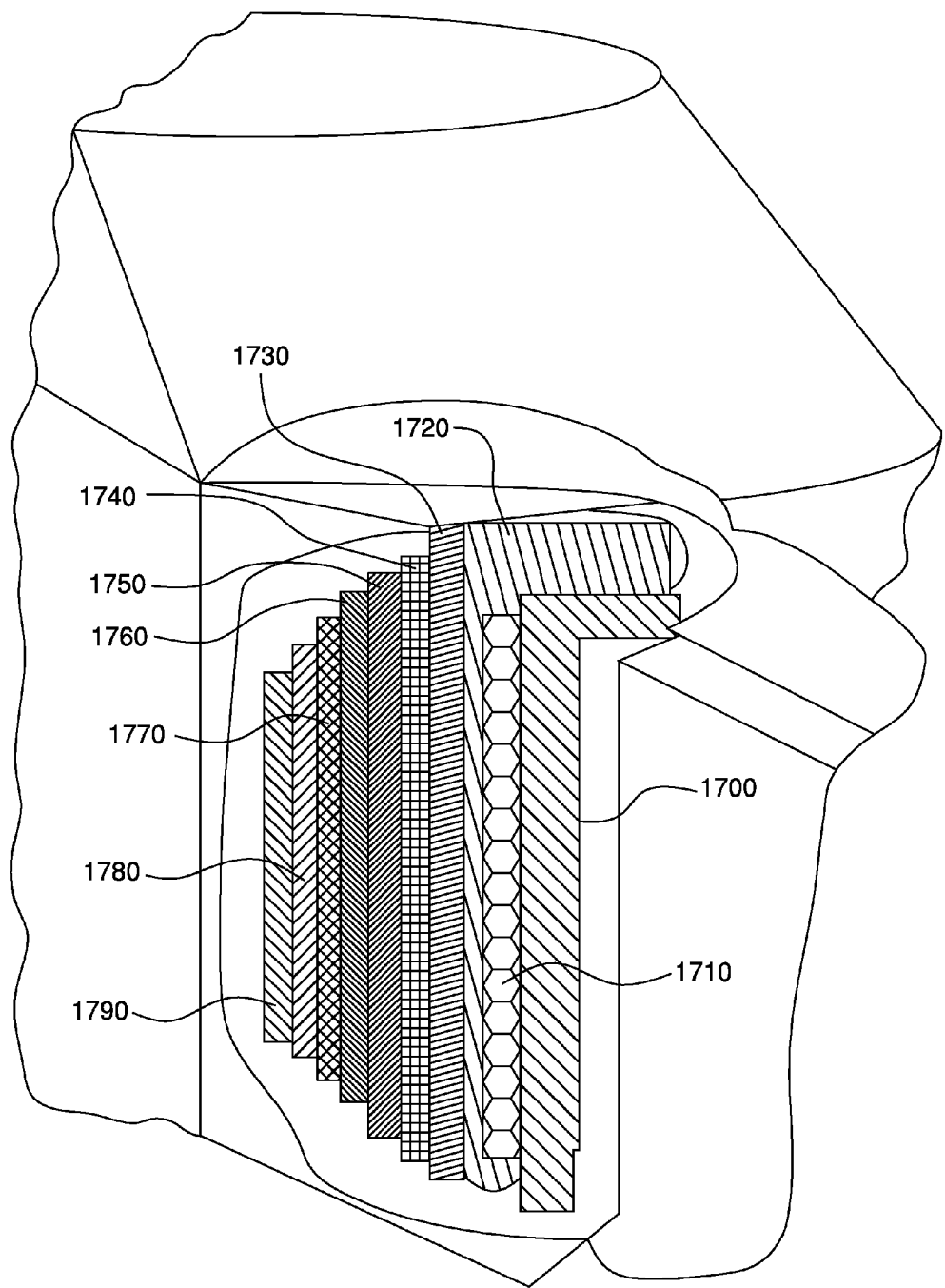
FIG. 17 illustrates the body panels and chassis of the electric vehicle in elemental form according to an exemplary embodiment of the present invention.

Preferably, the entire body of the vehicle 1200 is constructed to capture, convert and use thermal and photonic energy to either charge the vehicle 1200 or add charge to the solar harvesting strip 110. Therefore, when the vehicle is parked over a solar harvesting strip 110, the parked vehicle is adding charge to the solar harvesting strip 110. The body panels will be described with reference to FIGS. 16 and 17. The chassis and the body panels are first constructed of a carbon fiber sheet 1700, followed by a honeycomb structure 1710 and then topped off by a carbon fiber sheet 1720. The honeycomb structure 1710 may be filled with an electrolyte suspended in a polymer creating a gel type rechargeable battery or may contain a dielectric material. This composition creates a thin, lightweight structure that is much stronger than steel. It also creates five times the charging area found in a conventional electric vehicle, while decreasing the overall weight of the vehicle. The body panels 1230 of the vehicle 1200 further comprise preformed conduction areas including, but not limited to, electrical feeder lines 1610, graphite feeder lines 1620, preformed graphite conduction areas 1630 and preformed feeder lines 1640. Any of the conduction areas may be used for one or more of the headlights, side lamps, electric motors or the like. The use of preformed conduction areas to connect various components and charging devices drastically reduces the weight and cost of the vehicle. Further, the use of preformed conduction areas eliminates the need for a costly wiring harness, and allows for a completely modular construction of the vehicle. The body panels will simply plug into the electrical system in case of replacement and may be recycled.

The body panels 1230 will further be finished in a series of steps. The first coat will be a conductor material 1730 which functions as a negative conductor for the panel. Exemplary materials for the conductive material 1730 include graphite or powered metal. However, other materials may be used including the materials used for the conductors of conductive layer 240 of the solar harvesting strip 110. The next coat is comprised of a thermal harvesting material 1740. The thermal harvesting material may be the same material used for thermal harvesting layer 230 of the solar harvesting strip. The next coat is a dielectric material 1750, such as activated carbon or any other suitable dielectric material. Further, dielectric material 1750 may be the same material used as the dielectric material utilized in the conducting layer 240 of solar harvesting strip 110. Further, a conductive material 1760 will be applied over the thermal harvesting material and functions as a positively biased conductor. The conductive material 1760 may be the same material as conductor material 1730 or may be a different material. The conductor material 1730, dielectric material 1750 and conductor material 1760 form a parallel plate discharge capacitor. A photonic harvesting material 1770 is applied next. The photonic harvesting material 1770 could be any known photovoltaic material such as titanium or zinc oxides or dye sensitized photovoltaic materials. Dye sensitized photovoltaic materials could give the vehicle its color. Additionally, photonic harvesting material 1770 may comprise any of the materials used in photonic harvesting layer 250 or thermal-photonic harvesting layer 810 of the solar harvesting strip 110. Further, photonic harvesting material 1770 may be an amorphous thin film deposition of silicates. Next, a clear conductor 1780, such as indium tin oxide or mono-pole plastic, is applied having a negative bias. The final sealer 1790 is applied next, thereby completing the body of the electric vehicle 1200 that is a battery, a giant discharge capacitor and an electrical generator. The final sealer 1790 may be comprised of the same materials used for sealing layer 260 of the solar harvesting strip 110 or any other suitable material. These components are shown and arranged as one example, and in other embodiments of the present invention, components can be combined, added, removed and/or rearranged as required by the application or location.

Exemplary Embodiment of the Hydrogen Motor

Figure 18:
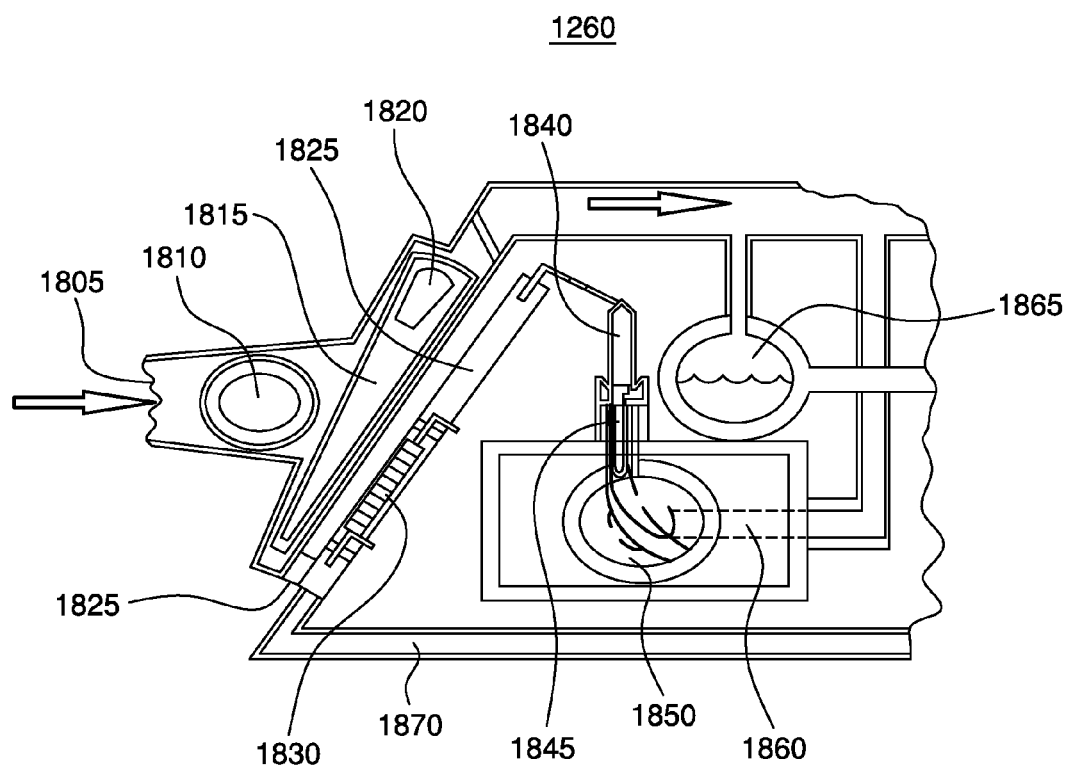
FIG. 18 illustrates an exemplary embodiment of an atmospheric intake hydrogen motor in elemental form.

FIG. 18 illustrates an exemplary embodiment of an atmospheric intake hydrogen motor in elemental form. The atmospheric intake hydrogen motor according to the exemplary embodiment uses a condensation electrolysis system to glean water from the atmosphere to be used as a source of hydrogen. By using atmosphere as the source of water, large heavy water stores are not required. While it is preferred that the atmospheric intake hydrogen motor be used as hydrogen motor 1260, hydrogen motor 1260 may be any other type of hydrogen motor. Further, while it is preferred that the atmospheric intake hydrogen motor 1260 be used for driving a charging system of an electric vehicle, the atmospheric intake hydrogen motor 1260 may be used in any other application requiring a motor. For example, the atmospheric intake hydrogen motor 1260 could be used for the generation of electricity at the utilities level.

The atmospheric intake hydrogen motor 1260 intakes atmosphere through an atmospheric intake. When used with electric vehicle 1200, atmosphere is introduced to a venting 1805 at the front of the generator. It is preferred but not required that atmospheric intake occur at a predetermined rate. It is further preferable that the atmospheric intake occur through a small intake fan (not shown) at the venting 1805 in front of the motor 1260. When the air travels through the venting 1805 the air is sampled by one or more sensors 1810 including air temperature, air speed, vacuum pressure, and barometric pressure sensors. The air temperature sensor determines the outside air temperature and/or temperature of the air passing through the vent 1805 for regulating the temperature of a bladder 1815. The air speed intake sensor determines the speed of incoming air. The vacuum pressure sensor determines the backflow pressure of the motor 1260. Preferably, the atmospheric intake hydrogen motor 1260 is controlled by a microprocessor (not shown) located on replaceable computer boards. However, the atmospheric intake hydrogen motor 1260 may be controlled by other means, including manual, mechanical, and other control means. The microprocessor receives signals from the sensors and controls any of the heating and cooling systems 1820, fan, and ignition 1845.

The atmospheric intake vent 1805 is constructed so as to confine the atmosphere inside of a bladder 1815. The bladder 1815 includes a cooling and/or heating system 1820 that heats and/or cools the bladder 1815 based on the sensed temperature and barometric pressure of the atmosphere. The heated or cooled bladder 1815, when in contact with the atmosphere, causes condensation to form in the bladder 1815. Preferably, the cooling system 1820 is operative to sonically cool the atmosphere, but any conventional cooling system may be used. The heating system 1820 may be any conventional heating system. The condensation is accumulated inside of a collection bladder 1815.

The water is then collected by gravity into an electrolysis chamber, preferably using a gravity valve 1825. In the electrolysis chamber, the water is placed on an electrolysis screen 1830 having alternating positive and negative conductors. On the electrolysis screen 1830 water droplets are electrolyzed by an electrical current which causes the separation of the hydrogen from the oxygen in the water. When atmospheric intake hydrogen motor 1260 is used with electric vehicle 1250, it is preferred that the electrical energy needed to separate the hydrogen from the oxygen is generated using electrical generation means imbedded in the tires 1560 of the electric vehicle 1250. The tires 1560 of the electric vehicle 1250 will be discussed in greater detail below. However, the electrical energy may also come from the batteries or a progressive discharge generator geared to the moving wheels. Moreover, after the atmospheric intake hydrogen motor 1260 begins generating electrical energy, part of or all of the electrical energy required to separate the hydrogen from the oxygen may be generated by the atmospheric intake hydrogen motor 1260.

After the hydrogen is separated from the oxygen, the hydrogen is collected at the top of a holding bladder 1825 and induced under vacuum pressure to an intake chamber 1840 to be used as a fuel. In the intake chamber 1840 the hydrogen is ignited by photon excitation or other ignition means. Preferably, the combustion is vectored along a vectored blast ridge to a rotating conical piston. In one embodiment, the combustion chamber 1850 of the engine houses a conically shaped piston which is attached to the stator of the alternator. After combustion, the conically shaped piston spins and thereby causes the alternator to generate electricity. In an alternative embodiment, the combustion chamber includes a conically shaped piston located within conically shaped piston receiver, wherein the conically shaped piston and conically shaped piston receiver each a have a magnetic orientation that is out of phase with the other. Here, once the hydrogen is ignited, the conically shaped piston spins inside the conically shaped piston receiver, thereby generating electricity. The alternative embodiment is advantageous in that efficiency is increased as the rotational speed is increased.

For either of the above embodiments, the exhaust of the combustion comprises water vapor and may be chambered via exhaust 1860 to a pressurized tank of salt water 1865 so as to add water to the tank. The tank of salt water 1865 is not required, but is preferred. The tank of salt water 1865 may be used to increases the efficiency of the electrolysis by introducing sodium to the electrolysis screen 1830. Further, the tank of salt water 1865 may be used as an initial and/or backup supply of water for the atmospheric intake hydrogen motor 1260 via supply line 1870. In addition the tank of salt water 1865 may function as a collection reservoir for collected rain water.

Preferably, the generated electricity is stored in one or more large discharge capacitors until said capacitors are completely charged. Once the discharge capacitors are completely charged they could be discharged into an electrical energy storage device. Exemplary electrical energy storage devices include battery/storage area 1430 of electric vehicle 1250, the chassis of electric vehicle 1250 and a large hybrid electrocell. An exemplary hybrid electrocell gleans the NOX2 from the fuel source and absorbs this emission which is a by product of the combustion of hydrogen.

The atmospheric intake hydrogen motor 1260 is advantageous for numerous reasons. When the atmospheric intake hydrogen motor 1260 is used in a vehicle charging system, the electrical energy storage device of the vehicle charging system can maintain a lower level of charge than is usually maintained in conventional electrical vehicles. Also, the motor 1260 should prove to be almost maintenance free since it contains a small number of moving parts. Additionally, all of the functions are controlled by computer boards that are easily replaceable. Moreover, it weighs far less than the conventional motors since it is constructed mainly of high impact plastic with ceramics being used in the high heat areas. Also, the atmospheric intake hydrogen motor 1260 does not require onboard vehicle storage of highly combustible gases. Further, no special batteries or expensive hydride reclamation units are required. In addition, the motor 1260 requires no petroleum products for lubrication. The motor 1260 has zero emissions, including zero oxides since the burning of atmospheric hydrogen results in only a small amount of water vapor emissions with pure, clean, oxygen as the main byproduct. Preferably, the motor 1260 is used simply as a charging unit and not as a means to propel the vehicle. The motor 1260 requires no mufflers, catalytic converters, or liquid fuels as do vehicles powered by internal combustion motors. The atmospheric intake hydrogen motor 1260 is far quieter than conventional engines. In a production assembly scenario, the atmospheric intake hydrogen motor 1260 is far easier to construct since it has about only twenty or so total parts, with only about three or so requiring mechanical motion. Because the atmospheric intake hydrogen motor 1260 is much smaller than conventional power plants, it can be used in multiples if necessary to facilitate charging of an electrical system. For example, more than one atmospheric intake hydrogen motor 1260 may be used on electric vehicle 1200.

Exemplary Embodiment of a Mechanical Energy Harvesting Device

Figure 19:
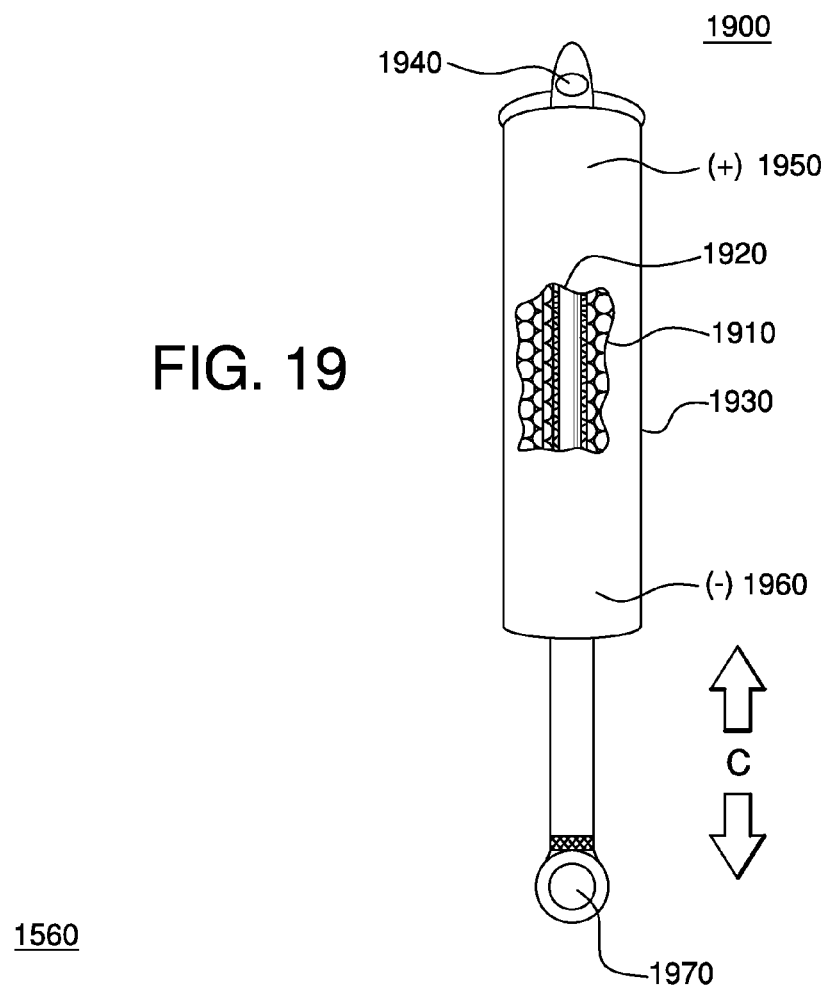
FIG. 19 illustrates a shock absorber for converting linear mechanical motion into electrical energy according an exemplary embodiment of the invention.

As mentioned above with respect to electric vehicle 1200, ancillary or backup electrical generation devices may be included with the vehicle to generate electricity. One such device is a linear mechanical energy harvesting device for converting linear mechanical motion into electrical energy. An exemplary embodiment of the mechanical energy harvesting device is a shock absorber 1900 for use in the suspension of electric vehicle 1250. FIG. 19 illustrates a shock absorber for converting mechanical motion into electrical energy, according an exemplary embodiment of the invention.

The shock absorber 1900 includes an electrical winding 1910 surrounding a travel rod 1920. The electrical winding 1910 may be covered by a housing 1930 and includes a first mount 1940 located on the end opposite the travel rod 1920. The electrical winding 1910 further includes positive and negative electrical connections 1950 and 1960. The travel rod 1920 is made of a magnetic material and is preferably made of magnetic stainless steel. The travel rod includes a second mount 1970 located on the end opposite the series of windings 1910. When the travel rod moves up or down along path C in either direction there is a current introduced in the winding 1910 by inductance. Preferably, path C is a linear path. A diode bridge (not shown) is used to orient the generated current with respect to movement of the travel rod along path C in either direction. The shock absorber 1900 further includes a thermal harvesting material to convert thermal energy generated in the mechanical energy harvesting device into electrical energy. The thermal harvesting material may be any of the thermal harvesting materials discussed above with respect to solar harvesting strip 110.

While the mechanical energy harvesting device has been described as a shock absorber 1900 in the above exemplary embodiment, in other embodiments, similar devices and methods are utilized to convert mechanical motion into usable electricity. Additional devices that may include a mechanical energy harvesting device include doors, hoods, hatchbacks, break and accelerator pedals, knobs, switches or any other arrangement in which a travel rod 1920 and a series of windings 1910 surrounding the travel rod 1920 are moveable relative to each other.

Exemplary Embodiment of an Electrical Energy Generating Tire

Figure 20:
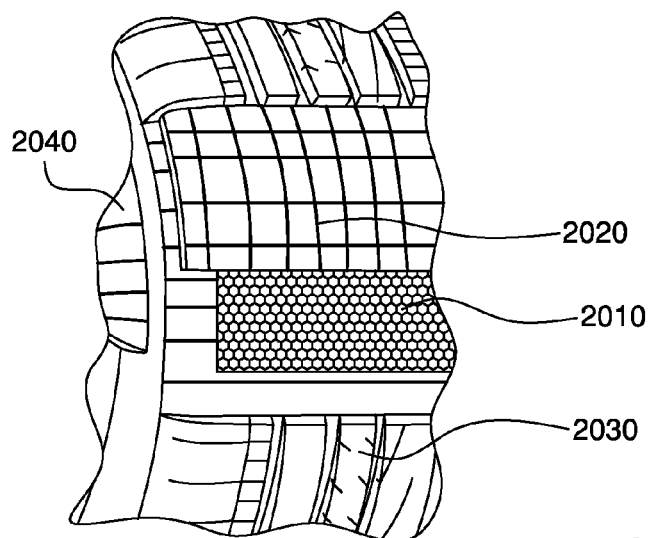
FIG. 20 illustrates an electrical energy generating tire according an exemplary embodiment of the invention.

Another ancillary or backup electrical generation device that may be included with the electric vehicle 1250 to generate electricity is an electrical energy generating tire 1560. FIG. 20 illustrates an electrical energy generating tire according an exemplary embodiment of the invention.

An electrical energy generating tire 1560 generates electricity as it rolls along a driving surface, such as driving surface 120. The tire has a preformed cavity which houses a piezo ceramic strip and/or thermal harvesting strip 2010 that is sandwiched between two reinforcement strips 2020 that are coated with a conductor material forming positive and negative conductors above and below the piezo ceramic strip and/or thermal harvesting strip 2010. Piezo ceramic strip comprises a Piezo ceramic material. Thermal harvesting strip comprises a thermal harvesting material, such as any of the thermal harvesting materials discussed above with respect to solar harvesting strip 110.

The exterior of the tire includes tire tread 2030. As the tire 1560 contacts the driving surface, the piezo ceramic strip is compressed and emits electrons that flow to the positive conductor. Likewise, the tire 1560 contacts the driving surface heat is generated in the tire from which thermal harvesting strip converts heat energy into electrical energy. Included in the tire is a sidewall conductor 2040. The electricity flows to the sidewall and up to the rib of the tire via sidewall conductor 2040. The rib contacts the inner portion of the rim, passing the electricity to the vehicle. The rim is separated into two halves that are electrically insulated from each other. Preferably, the outer portion of the rim functions as the positive side and the inner portion functions as the negative side. However, the polarity of the sides may be switched. Further, it is preferred that the electricity generated by the tires will be used to provide electricity for the atmospheric intake hydrogen motor 1260. By using the electricity generated by the tires for the hydrogen generator, the overall charge of the vehicle will not be affected by hydrogen production.

While the invention has been shown and described with reference to certain embodiments thereof, it will be understood by those skilled in the art that various changes in form and details may be made therein without departing from the spirit and scope of the invention as defined by the appended claims and their equivalents.

What is claimed is:

1. A method for harvesting solar energy, the method comprising:
   depositing a plurality of layers onto a surface area that is incident to solar energy, wherein at least one of the plurality of layers comprises at least one solar energy harvesting material bonded to the surface area and at least one of the plurality of layers comprises at least one permanent magnetic material bonded to the surface area; and
   converting at least one of thermal and photonic energy into electrical energy by the at least one solar energy harvesting material, wherein the at least one solar energy harvesting material is located within a magnetic field generated by the at least one permanent magnetic material;
   wherein the step of depositing a plurality of layers comprises:
   applying a bonding layer onto a surface;
   applying a magnetic layer directly on top of the bonding layer and in fixed relation thereto;
   applying a conductive layer onto the magnetic layer and in fixed relation thereto;
   applying an energy harvesting layer onto the conductive layer and in fixed relation thereto, said energy harvesting layer further comprising a plurality of carbon buckyballs having a thermal energy harvesting material on at least a portion of the exterior of each buckyball, and a photonic energy harvesting material on at least a portion of each buckyball, wherein each said buckyball defines a first hemisphere and a second hemisphere, and wherein the first and second hemisphere each comprise a hollow portion comprising a carbon nanotube and one of a dielectric and magnetic material; and
   applying a transparent sealing layer onto the energy harvesting layer and in fixed relation thereto.

2. The method according to claim 1, wherein at least one discharge capacitor is comprised by one or among more than one of the plurality of layers, the discharge capacitor comprising at least two conductors that are spaced apart and substantially parallel and at least one dielectric material between the conductors, wherein the at least one discharge capacitor is charged by the electrical energy and augments the magnetic field.

3. The method according to claim 1, wherein the at least one magnetic material is deposited as a line array of a plurality of adjacent magnet portions substantially parallel to the surface area and substantially parallel to each other, wherein opposing polar regions of each of the plurality of magnet portions are oriented such that a line between the opposing polar regions of each of the plurality of magnet portions is perpendicular to the line array, further wherein each of the plurality of magnet portions have a substantially similar or opposite magnetic field orientation.

4. The method of claim 1, wherein the magnetic material is at least partially used for retaining and conveying information by staggering or eliminating portions of the magnetic material, or by adding diamagnetic material to the magnetic material to act as a magnetic field modifier.

5. The method of claim 1, wherein one of the plurality of layers comprises a basecoat on which the magnetic material is deposited and another one of the plurality of layers comprises a transparent sealant material.

6. The method according to claim 1, wherein the surface area that is incident to solar energy is one of a driving surface and a body panel of a vehicle.

7. A multiple layer solar energy harvesting composition for deposition onto a surface area that is incident to solar energy, the composition comprising:
   at least one permanent magnetic material bonded to the surface area, for generating a magnetic field, wherein at least one of the multiple layers comprises the permanent magnetic material;
   an energy harvesting layer bonded on top of the magnetic material, said energy harvesting layer further comprising a plurality of carbon buckyballs having a thermal energy harvesting material on at least a portion of the exterior of each buckyball, and a photonic energy harvesting material on at least a portion of each buckyball, wherein each said buckyball defines a first hemisphere and a second hemisphere, and wherein the first and second hemisphere each comprise a hollow portion comprising a carbon nanotube and one of a dielectric and magnetic material;
   wherein said energy harvesting layer is located within a magnetic field generated by the at least one permanent magnetic material.

8. The multiple layer solar energy harvesting composition according to claim 7, wherein at least one discharge capacitor is comprised by one or among more than one of the multiple layers, the discharge capacitor comprising at least two conductors that are spaced apart and substantially parallel and at least one dielectric material between the conductors, wherein the at least one discharge capacitor is charged by the electrical energy and augments the magnetic field.

9. The multiple layer solar energy harvesting composition according to claim 8, wherein at least one layer of said multiple layer solar energy harvesting composition is deposited by spraying, hand application, or film deposition.

10. The multiple layer solar energy harvesting composition according to claim 7, wherein the at least one magnetic material is deposited as a line array of a plurality of adjacent magnet portions substantially parallel to the surface area and substantially parallel to each other, wherein opposing polar regions of each of the plurality of magnet portions are oriented such that a line between the opposing polar regions of each of the plurality of magnet portions is perpendicular to the line array, further wherein each of the plurality of magnet portions have a substantially similar or opposite magnetic field orientation.

11. The multiple layer solar energy harvesting composition of claim 7, wherein the magnetic material is at least partially used for retaining and conveying information by staggering or eliminating portions of the magnetic material, or by adding diamagnetic material to the magnetic material to act as a magnetic field modifier.

12. The multiple layer solar energy harvesting composition of claim 7, wherein one of the plurality of layers comprises a basecoat on which the magnetic material is deposited and another one of the plurality of layers comprises a transparent sealant material.

13. The multiple layer solar energy harvesting composition according to claim 7, wherein the surface area that is incident to solar energy is one of a driving surface and a body panel of a vehicle.

14. A method for harvesting solar energy, the method comprising:
depositing a plurality of layers onto a surface area that is incident to solar energy such that the plurality of layers are adhesively bonded to the surface area, wherein at least one of the plurality of layers comprises an energy harvesting layer comprising a plurality of carbon buckyballs having a thermal energy harvesting material on at least a portion of the exterior of each buckyball, and a photonic energy harvesting material on at least a portion of each buckyball, wherein each said buckyball defines a first hemisphere and a second hemisphere, and wherein the first and second hemisphere each comprise a hollow portion comprising a carbon nanotube and one of a dielectric and magnetic material; and
converting thermal and photonic energy into electrical energy by the energy harvesting layer.

15. The method according to claim 14, wherein the depositing of the plurality of layers onto a surface area comprises depositing one or more of the plurality of layers by spraying, hand application, or film deposition.

16. The method according to claim 14, wherein at least one of the plurality of layers comprises a magnetic material for generating a magnetic field, the magnetic material being deposited as a line array of a plurality of adjacent magnet portions substantially parallel to the surface area and substantially parallel to each other, wherein opposing polar regions of each of the plurality of magnet portions are oriented such that a line between the opposing polar regions of each of the plurality of magnet portions is perpendicular to the line array, further wherein each of the plurality of magnet portions have a substantially similar or opposite magnetic field orientation.

17. The method according to claim 16, wherein at least one discharge capacitor is comprised by one or among more than one of the plurality of layers, the discharge capacitor comprising at least two conductors that are spaced apart and substantially parallel and at least one dielectric between the conductors, wherein the at least one discharge capacitor is charged by the electrical energy and augments the magnetic field.

* * * * *